United States Patent
Kawakubo

(10) Patent No.: US 8,130,362 B2
(45) Date of Patent: Mar. 6, 2012

(54) CORRECTION METHOD AND EXPOSURE APPARATUS

(75) Inventor: Masaharu Kawakubo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 552 days.

(21) Appl. No.: 11/662,725

(22) PCT Filed: Sep. 12, 2005

(86) PCT No.: PCT/JP2005/016721
§ 371 (c)(1),
(2), (4) Date: Mar. 22, 2007

(87) PCT Pub. No.: WO2006/030727
PCT Pub. Date: Mar. 23, 2006

(65) Prior Publication Data
US 2009/0153817 A1    Jun. 18, 2009

(30) Foreign Application Priority Data
Sep. 14, 2004   (JP) .................... 2004-267139

(51) Int. Cl.
*G03B 27/42* (2006.01)
*G03B 27/58* (2006.01)
*G03B 27/32* (2006.01)
*G03B 27/68* (2006.01)

(52) U.S. Cl. .......... 355/53; 355/52; 355/72; 355/77

(58) Field of Classification Search .......... 355/30, 355/52, 53, 72–74, 77; 356/399–401; 430/8, 430/30, 311, 312; 700/114, 120; 250/492.1, 250/492.2, 492.22, 548, 441.11
See application file for complete search history.

(56) References Cited

U.S. PATENT DOCUMENTS 4,907,021 A * 3/1990 Yabu ................. 353/101
5,270,771 A * 12/1993 Sato .................. 355/53
(Continued)

FOREIGN PATENT DOCUMENTS

EP        1 603 153 A1    12/2005
(Continued)

OTHER PUBLICATIONS

English translation of JP2004-265957, priority document for WO2004/077534, published Sep. 10, 2004. Translation obtained on Dec. 22, 2009.*

(Continued)

*Primary Examiner* — Peter B Kim
*Assistant Examiner* — Christina Riddle
(74) *Attorney, Agent, or Firm* — Oliff & Berridge, PLC

(57) ABSTRACT

At Step 602, the grid of a wafer loaded into an exposure apparatus is approximated by a mathematical function fitting up to, for example, a cubic function, and at Step 612, the magnitude of a residual error between the position of a sample shot area obtained by the function and an actually measured position is compared with a predetermined threshold value. GCM measurement is performed in a mathematical function mode in a subroutine 616, or it is performed in a map mode in a subroutine 616, on the basis of the result of the comparison. In addition, it is determined whether to extract non-linear components from the wafer in each lot on the basis of a variation in the temperature of the wafer (Step 622) and a variation in random error between the wafers (Step 624).

25 Claims, 11 Drawing Sheets

U.S. PATENT DOCUMENTS

| | | | |
|---|---|---|---|
| 5,525,808 A * | 6/1996 | Irie et al. | 250/548 |
| 5,561,606 A | 10/1996 | Ota et al. | |
| 5,883,704 A * | 3/1999 | Nishi et al. | 355/67 |
| 5,986,766 A | 11/1999 | Koga et al. | |
| 2002/0042664 A1 | 4/2002 | Kikuchi | |
| 2004/0072086 A1* | 4/2004 | Noudo et al. | 430/22 |
| 2004/0126004 A1* | 7/2004 | Kikuchi | 382/141 |
| 2005/0213067 A1* | 9/2005 | Van Der Feltz et al. | 355/67 |
| 2006/0040191 A1 | 2/2006 | Okita | |
| 2007/0052939 A1* | 3/2007 | Ishii et al. | 355/53 |
| 2007/0109524 A1* | 5/2007 | Kawakubo et al. | 355/77 |

FOREIGN PATENT DOCUMENTS

| | | |
|---|---|---|
| JP | A 9-218714 | 8/1997 |
| JP | A 2001-345243 | 12/2001 |
| JP | A 2002-353121 | 12/2002 |
| JP | A-2003-086483 | 3/2003 |
| WO | WO 2004/077534 A1 | 9/2004 |

OTHER PUBLICATIONS

European Search Report issued in Application No. EP 05 78 2373 on Feb. 2, 2011.

May 6, 2011 Office Action issued in Japanese Application No. 2006-535868 (with translation).

* cited by examiner

CORRECTION METHOD AND EXPOSURE APPARATUS

TECHNICAL FIELD

The present invention relates to a correction method and an exposure apparatus, and more particularly, to a correction method of, when a plurality of divided areas are formed by pattern transfer on each of a plurality of photosensitive objects sequentially loaded into an exposure apparatus, correcting the position of each of the photosensitive objects and to an exposure apparatus for forming by pattern transfer a plurality of divided areas on each of a plurality of photosensitive objects.

BACKGROUND ART

In order to prevent a reduction in yield in a manufacturing line of microdevices, such as semiconductor devices, it is necessary to keep the interlayer overlay accuracy of overlay exposure at a high level by overlaying circuit patterns or the like in several layers onto a substrate such as a wafer or the like (hereinafter, referred to as a wafer), to form by pattern transfer shot areas in a lithography process.

When the overlay exposure is performed using a plurality of exposure apparatuses, an error between the stage grids of the exposure apparatuses (an error between stage coordinate systems for defining the movement position of the wafer in each exposure apparatus) may occur, which is a factor causing a reduction in the overlay accuracy. Even when the error between the stage grids of the exposure apparatuses is so small as to be negligible or the same exposure apparatus is used to expose the layers, the arrangement of shot areas on the previous layer may be distorted in the wafer subjected to processes such as, resist coating, development, etching, CVD (chemical vapor deposition), and CMP (chemical mechanical polishing), due to the processes. The distortion may cause a reduction in the overlay accuracy.

When a linear error occurs in the arrangement grid of shot areas on the previous layer of the wafer, the linear error is removed by an EGA (enhance global alignment) wafer alignment of measuring coordinates of only a plurality of sample shot areas selected beforehand (three or more sample shot areas, for example, 7 to 15 sample shot areas are needed) among shot areas on a wafer and calculating coordinates of all shot areas (arrangement coordinates of shot areas) on the wafer on the basis of the measured result by using a statistical operation (least square method or the like), which makes it possible to accurately perform the overlay exposure (for example, see Patent Document 1). However, when non-linear components of the grid cannot be negligible, it is difficult to remove the non-linear components by using the EGA wafer alignment.

Therefore, an exposure apparatus having a grid correcting function (a first grid correcting function) has been proposed (for example, see Patent Document 2). The grid collecting function measures a larger number of positional information of shot areas on, for example, a predetermined number of wafers counting from the head of each lot than that in the EGA wafer alignment, extracts non-linear components of the grid detected on the basis of the actually measured value of the positional information obtained by the measurement, regards the non-linear components as substantially the same between the wafers in a lot, and corrects the position of a wafer for the arrangement coordinates of all shot areas on each of the subsequent wafers in the lot that are obtained by a conventional EGA wafer alignment, using the non-linear components extracted from a predetermined number of wafers from the head of the lot as correction information, thereby performing overlay exposure.

The exposure apparatus disclosed in Patent Document 2 also has a correction function (a second correction function) of loading, for example, a reference wafer or the like having a plurality of shot areas arranged in an array along a reference grid, which is a reference of overlay exposure for exposure apparatus, into each exposure apparatus before lot processing, extracting non-linear components of the grid defined by the detection result of the reference grid, and correcting the position of a stage such that exposure is performed in a state aligned with the reference grid.

In the exposure apparatus, the first correction function or the second correction function is selected according to a variation in overlay error between a plurality of lots that are continuously processed in the exposure apparatus. The selection is performed to reduce the number of times the shot areas are measured to measure coordinates, from the viewpoint of preventing reduction in throughput. For example, when the variation in overlay error between a plurality of lots that are continuously processed in the exposure apparatus is relatively small, it is possible to regard the non-linear components of the grid in the exposure apparatus as being substantially the same between the lots. Therefore, in this case, the non-linear components of the lot previously processed are used as non-linear components of a lot currently processed, which makes it possible to perform the selection so as to reduce the number of times the shot areas are measured.

However, in recent years, it is necessary to perform overlay exposure considering high-degree non-linear components of the grid, in order to improve overlay accuracy. With the balance between the above-mentioned background and throughput, several correction function in which degree of non-linear components of a grid that can be considered are different have been proposed, so that the correction functions are more diversified and subdivided. Therefore, as described above, it is insufficient to use only the variation in the overlay error among a plurality of lots continuously processed in the exposure apparatus as a standard for the selection of the correction function, and thus a new selection standard capable of selecting an optimum function from a plurality of correction functions on the basis of accurate determination is needed.

Patent Document 1: U.S. Pat. No. 4,780,617
Patent Document 2: U.S. Published Application No. 2002/0042664

DISCLOSURE OF THE INVENTION

Problem that the Invention is to Solve

According to a first aspect of the invention, there is provided a correction method of, when a plurality of divided areas are formed by pattern transfer on each of a plurality of photosensitive objects that are sequentially loaded into an exposure apparatus, correcting the position of each of the photosensitive objects. The method includes: selecting at least one of a plurality of correction functions that have different degree of non-linear components that can be considered, the correction functions being provided in the exposure apparatus in order to correct the position of the photosensitive object, considering the non-linear components of a two-dimensional grid, which is a reference for the position where each of the divided areas is formed, on the basis of predetermined information associated with at least one of the exposure apparatus and the photosensitive object loaded into the exposure apparatus.

According to the above-mentioned aspect, when the exposure apparatus has a plurality of correction functions that have different degree of non-linear components that can be considered, among the non-linear components of the two-dimensional grid, which is a reference for the position where each of the divided areas is formed, it is possible to select at least one optimum correction function, on the basis of predetermined information associated with at least one of the exposure apparatus and the photosensitive object loaded into the exposure apparatus. Therefore, when a plurality of divided areas are formed on a photosensitive object, it is possible to effectively correct non-linear components of a two-dimensional grid, which is a reference for the position where each of the divided areas is formed, in a short time.

Further, according to a second aspect of the invention, there is provided an exposure apparatus for forming by pattern transfer a plurality of divided areas on each of a plurality of photosensitive objects. The exposure apparatus includes: a transfer device that includes a movable body for holding a loaded photosensitive object and forming by pattern transfer the plurality of divided areas on the photosensitive object held by the movable body; a selection device that selects at least one of a plurality of correction functions having different degree of non-linear components that can be considered, the correction functions being provided to correct the position of the photosensitive object, considering non-linear components of a two-dimensional grid, which is a reference for the position where each of the divided areas is formed, on the basis of predetermined information associated with at least one of the transfer device and the photosensitive object held by the movable body; and a correction device that has the plurality of correction functions and uses the correction function selected by the selection device to correct the position of the photosensitive object held by the movable body when the photosensitive object held by the movable body is aligned at a predetermined position.

According to the above-mentioned aspect, when the correction device has a plurality of correction functions that have different degree of non-linear components that can be considered, among the non-linear components of the two-dimensional grid, which is a reference for the position where each of the divided areas is formed on the photosensitive object loaded into the transfer device, it is possible to select at least one optimum correction function, on the basis of predetermined information associated with at least one of the transfer device and the photosensitive object loaded into the transfer device. Therefore, when a plurality of divided areas are formed on the photosensitive object loaded into the transfer device, it is possible to effectively correct non-linear components of a two-dimensional grid, which is a reference for the position where each of the divided areas is formed, in a short time.

BEST MODE FOR CARRYING OUT THE INVENTION

Figure 1:
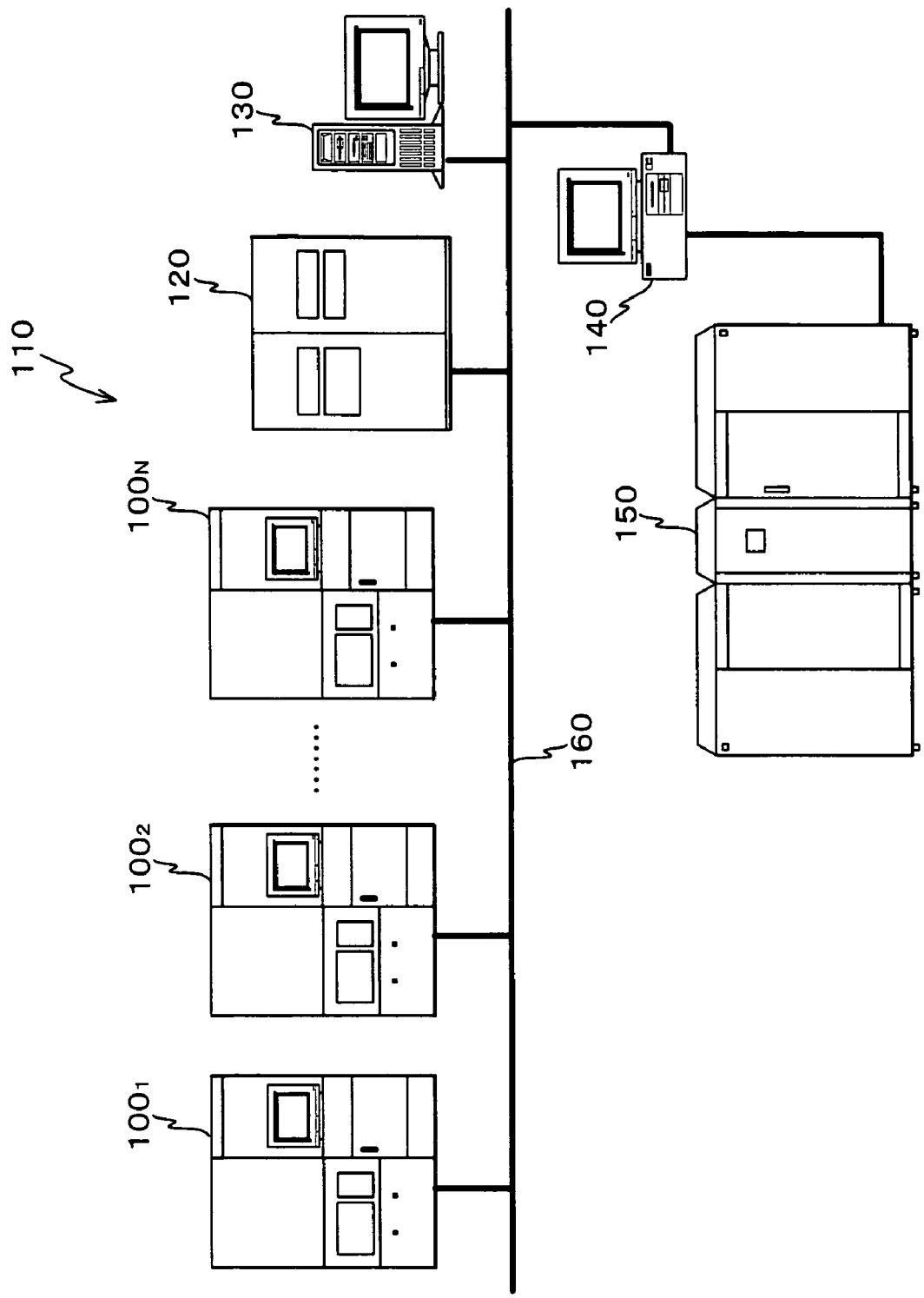
FIG. 1 is a diagram schematically illustrating the overall structure of a lithography system according to an embodiment of the invention.

FIG. 1 is a diagram schematically illustrating the overall structure of a lithography system 110 according to an embodiment of the invention. The lithography system 110 is provided as a portion of a microdevice manufacturing line to perform a lithography process on a plurality of wafers, which are bases of the microdevices. In the lithography system 110, a plurality of wafers are managed in a predetermined processing unit, which is called a lot (for example, one lot is composed of 25 wafers), and the lithography process is performed on each lot of wafers.

The lithography system 110 includes N exposure apparatuses $100_1$, $100_2$, ..., $100_N$, a overlay measuring instrument 120, a central information server 130, a terminal server 140, a host computer 150 and the like. The exposure apparatuses $100_1$ to $100_N$, the overlay measuring instrument 120, the central information server 130, and the terminal server 140 are connected to one another through a local area network (LAN) 160. The host computer (hereinafter, simply referred to as a host) 150 is connected to the LAN 160 through the terminal server 140. That is, in the hardware structure, a communication path is ensured among the exposure apparatuses $100_i$ (where i=1 to N), the overlay measuring instrument 120, the central information server 130, the terminal server 140, and the host 150.

When wafers W in one lot on which a photoresist is applied by a coater/developer (hereinafter, referred to as C/D) connected in a line are sequentially loaded into each of the exposure apparatuses $100_i$, the image of a circuit pattern of a reticle R, serving as a projection original plate having for example a circuit pattern formed thereon, is formed by illumination light, such as a laser beam, and the image of the circuit pattern is projected onto each of the loaded wafers at a plurality of points by a projection optical system, which will be described later, thereby exposing the wafers. Then, the image of the circuit pattern is transferred onto the wafers so that divided areas (hereinafter, referred to as shot areas) are sequentially formed on each of the wafers. Each of the exposure apparatuses $100_1$ to $100_N$ may be a step and repeat projection exposure apparatus (a so-called stepper), or it may be a step and scan projection exposure apparatus (hereinafter, referred to as a scanning-type exposure apparatus). In the following description, the exposure apparatus $100_1$ is a scanning-type exposure apparatus having a plurality of correction functions (hereinafter, referred to as a grid correction function) having different correction conditions for a non-linear inter-shot error. The exposure apparatuses $100_1$ to $100_N$ log various types of information items (for example, information on the value of an EGA parameter calculated by an EGA (enhance global alignment) wafer alignment, which will be described later, and a residual error, an alignment parameter for defining an alignment process, which will be described later, and a detection signal (EGA log data) detected by the alignment system AS when each of the wafers W in each of the lots is exposed. The detailed structure of the exposure apparatus $100_1$ will be described later.

In the lithography system 110, overlay exposure is performed on the wafer W to form by pattern transfer the shot areas on several layers by a transfer method. However, due to the schedule of a lithography process, the shot areas on each layer of the wafer W may be formed by pattern transfer by different exposure apparatuses. In this case, particularly, it is necessary to manage the overlay accuracy of shot areas on each layer. Therefore, the lithography system 110 is provided with the overlay measuring instrument 120. For example, the overlay measuring instrument 120 measures an overlay error of shot areas on each layer for a plurality of head wafers in each of the lots that are continuously processed, or for a pilot wafer (test wafer).

The pilot wafer or the like is exposed by a predetermined exposure apparatus (any one of the exposure apparatuses $100_1$ to $100_N$) depending on a process. The pilot wafer is loaded prior to a process wafer of a lot corresponding to an exposure apparatus (exposure apparatuses $100_1$ to $100_N$) that is likely to be used for the next and subsequent layers, with a pattern having already been formed on one or more layers, and a reticle pattern (which includes at least a registration measuring mark (overlay error measuring mark)) is actually transferred onto the pilot wafer by the exposure apparatus, and is then developed. Then, the pilot wafer is loaded into the overlay measuring instrument 120. The overlay measuring instrument 120 measures an overlay error (a relative position error) of the images (for example, resist images) of registration measuring marks that are formed on the loaded wafer when different layers are exposed, and performs a predetermined operation to calculate overlay error information (overlay error information between a predetermined exposure apparatus and an exposure apparatus that is likely to be used for the next and subsequent layers). That is, in this way, the overlay measuring instrument 120 measures overlay error information between exposure apparatuses on the basis of the exposure result of each pilot wafer.

A control system (not shown) of the overlay measuring instrument 120 performs communication with the central information server 130 through the LAN 160 to transmit or receive predetermined data, such as overlay error data, which will be described later. In addition, the overlay measuring instrument 120 performs communication with the host 150 through the LAN 160 and the terminal server 140. Further, the overlay measuring instrument 120 may communicate with the exposure apparatuses $100_1$ to $100_N$ through the LAN 160.

The central information server 130 includes a large capacity storage device and a processor. The large capacity storage device has exposure history data for lots of wafers W stored therein. The exposure history data includes, for example, the history of various information items having an effect on the exposure result of the wafers in each of the lots that are logged in the exposure apparatus $100i$, and overlay error information between each exposure apparatus $100_i$ and another exposure apparatus that is measured by using pilot wafers corresponding to the wafers of each lot measured by the overlay measuring instrument 120 beforehand.

In this embodiment, the overlay error between specific layers is calculated by the control system of the overlay measuring instrument 120 (or another computer). The control system of the overlay measuring instrument 120 (or another computer) calculates the over lay error on the basis of the overlay error information that is measured for a pilot wafer (test wafer) or a plurality of head wafers in each lot. Then, the calculated overlay error data is transmitted from the overlay measuring instrument 120 to the central information server 130 and is then stored in the large capacity storage device of the central information server 130.

The terminal server 140 has a gateway processor for absorbing the difference between a communication protocol of the LAN 160 and a communication protocol of the host 150. The terminal server 140 enables communication among the host 150, and the exposure apparatuses $100_1$ to $100_N$ and the overlay measuring instrument 120 connected to the LAN 160.

The host 150 generally controls wafer processing processes including at least a lithography process. For example, in the lithography system 110, since the lithography process needs to be simultaneously performed on a plurality of lots, the host 150 makes a schedule on which exposure apparatus $100_1$ to $100_N$ should expose which lot of wafers. For example, when the exposure apparatus $100_1$ completes an exposure process and has no wafer therein, the host 150 instructs the exposure apparatus $100_1$ to expose the lot of wafers in next exposure turn through the terminal server 140. Selection of an exposure apparatus to be used is made, considering the performances and characteristics of the exposure apparatuses $100_1$ to $100_N$ in view of overlay accuracy of shot areas, in addition to whether the exposure apparatus has no wafer therein.

<Exposure Apparatus>

Figure 2:
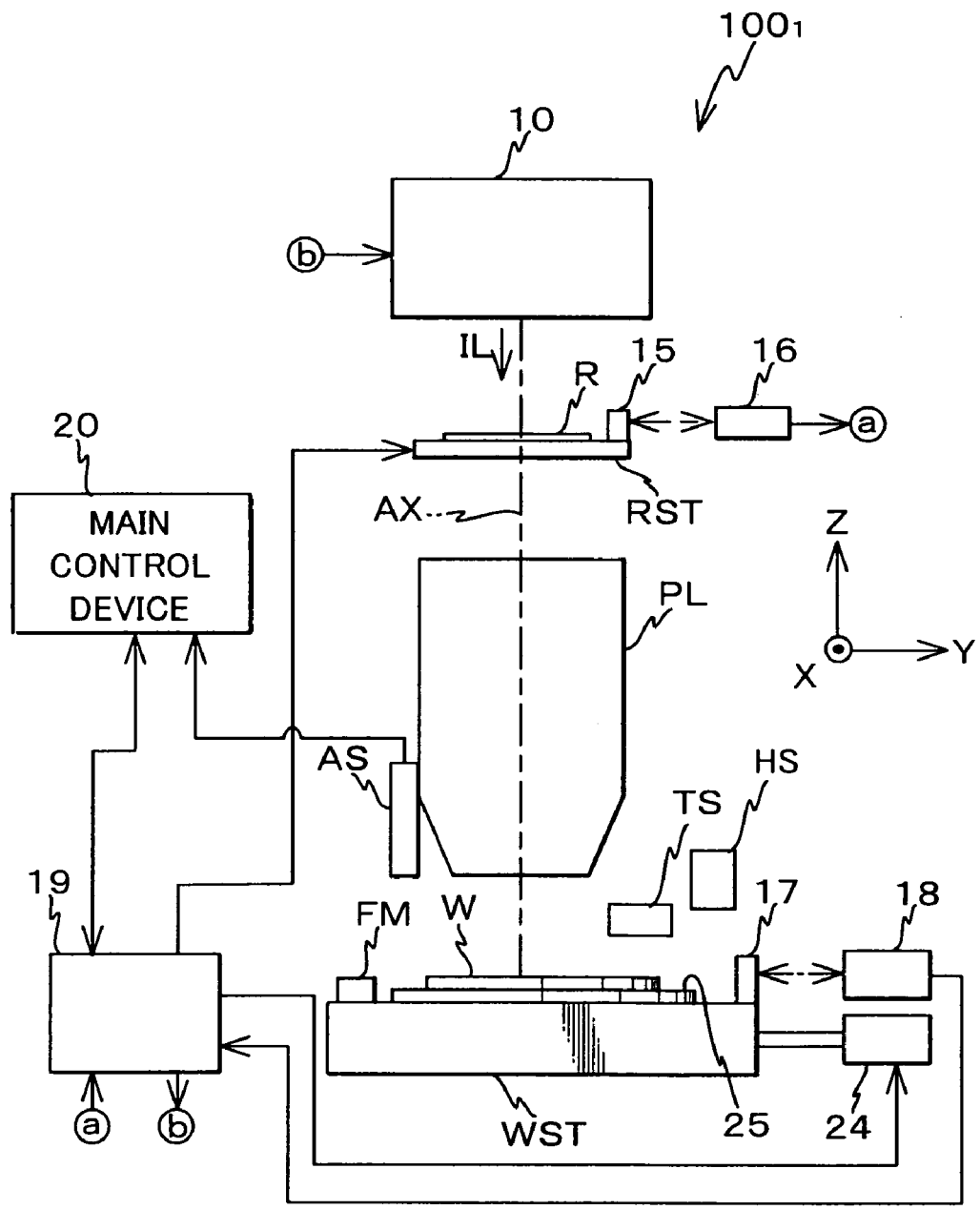
FIG. 2 is a diagram schematically illustrating an exposure apparatus $100_1$ of FIG. 1.

FIG. 2 is a diagram schematically illustrating the structure of the exposure apparatus $100_1$, which is a representative of the exposure apparatuses $100_1$ to $100_N$. The exposure apparatus $100_1$ includes an illumination system 10, a reticle stage RST for holding a reticle R, a projection optical system PL, a wafer stage WST, serving as a moving body, on which a wafer W is loaded as a photosensitive object, and a main control device 20 for generally controlling the entire apparatus. The exposure apparatus $100_1$ is a scanning-type exposure apparatus.

As disclosed in Japanese Unexamined Patent Application Publication No. 2001-313250 and U.S. Published Application No. 2003/0025890 corresponding thereto, the illumination system 10 includes a light source, an illuminance uniformizing optical system having an optical integrator, a relay lens, a variable ND filter, a reticle blind (which is also called a masking blade), a dichroic mirror and the like, which are not shown. In the illumination system 10, slit-shaped illumination area on the reticle R having a circuit pattern drawn thereon, which is defined by a reticle blind, are illuminated by illumination light IL with substantially uniform illuminance. As long as the domestic statutes of designated states (or selected states) of this international application permit, the entire disclosure of Japanese Unexamined Patent Application Publication No. 2001-313250 and U.S. Published Application No. 2003/0025890 corresponding thereto is hereby incorporated by reference herein in its entirety.

Any of the following rays is used as the illustration light IL: a distant ultraviolet light (DUV), such as KrF excimer laser light (having a wavelength of 248 nm) and a vacuum ultraviolet light (VUV), such as ArF excimer laser light (having a wavelength of 193 nm) or $F_2$ laser light (having a wavelength of 157 nm). It is possible to use, for example, lines in an ultraviolet region (for example, the g-line, the i-line) that are emitted from an extra-high pressure mercury lamp as the illumination light IL. In addition, a fly eye's lens, a rod integrator (inner-side-reflective integrator), or a diffraction optical element is used as the optical integrator.

The reticle R is fixed on the reticle stage RST by, for example, vacuum suction. The Reticle stage RST is finely drivable in an XY plane perpendicular to the optical axis of the illumination system 10 (aligned with an optical axis AX of the projection optical system PL, which will be described later) by a reticle stage driving portion (not shown) including, for example, a linear motor and the like. In addition, the Reticle stage RST can be driven at a predetermined scanning speed in a predetermined direction (in FIG. 2, a Y-axis direction, which is a horizontal direction in the plane of the drawing).

The position of the reticle stage RST in the plane where the stage moves is constantly detected by a reticle laser interferometer (hereinafter, referred to as a reticle interferometer) 16 through a movable mirror 15 at a resolution of, for example, about 0.5 to 1 nm. Positional information of the reticle stage RST from the reticle interferometer 16 is supplied to a stage control device 19 and to a main control device 20 through the stage control unit 19. The stage control device 19 controls a reticle stage driving unit (not shown) to drive the reticle stage RST, on the basis of the positional information of the reticle stage RST, according to instructions from the main control device 20. A pair of reticle alignment systems (not shown) are arranged above the reticle R. Since the structure of the pair of reticle alignment systems is disclosed in, for example, Japanese Unexamined Patent Application Publication No. 7-176468 and U.S. Pat. No. 5,646,413 corresponding thereto, a detailed description thereof will be omitted herein. As long as the domestic statutes of designated states (or selected states) of this international application permit, the entire disclosure of Japanese Unexamined Patent Application Publication No. 7-176468 and U.S. Pat. No. 5,646,413 corresponding thereto is hereby incorporated by reference herein in its entirety.

The projection optical system PL is provided below the reticle stage RST in FIG. 2 and the optical axis AX thereof is a Z-axis direction. For example, a bitelecentric reduction system is used as the projection optical system PL. The projection optical system PL has a projection magnification of, for example, ¼, ⅕, or ⅙. Therefore, when the illumination light IL is radiated onto the reticle R from the illumination system 10, the illumination light IL sequentially passes through the reticle R and the projection optical system PL so that a reduced image (a partial image) of the circuit pattern of the reticle R in the radiated area (the above-mentioned illumination area) of the illumination light is formed on the wafer W having a resist (photosensitive agent) on the surface thereof.

The wafer stage WST is provided below the projection optical system PL and above a base (not shown) in FIG. 2, and is driven by a wafer stage driving unit 24 including, for example, a linear motor in a Y-axis direction and an x-axis direction (a direction perpendicular to the plane of FIG. 2) perpendicular to the Y-axis direction at a predetermined stroke. In addition, the wafer stage WST can be finely driven in the Z-axis direction, a θx direction, a θy direction, and a θz direction (rotational direction about a Z-axis). A wafer holder 25 is provided on the wafer stage WST, and the wafer W is fixed on the wafer holder 25 by, for example, vacuum suction.

The position of the wafer stage WST in the XY plane is detected at all times by a wafer laser interferometer 18 through a movable mirror 17 provided on the upper surface of the wafer stage WST at a resolution of, for example, about 0.5 to 1 nm. Actually, a Y movable mirror 17 that has a reflection surface orthogonal to the scanning direction (the Y-axis direction) and an X movable mirror that has a reflection surface orthogonal to a non-scanning direction (the X-axis direction) are provided on the wafer stage WST, and in correspondence with these movable mirrors, as the wafer laser interferometers, an X interferometer that radiates an interferometer beam in a direction vertical to the X movable mirror and a Y interferometer that radiates an interferometer beam in a direction vertical to the Y movable mirror are provided. However, a movable mirror 17 and a wafer laser interferometer system 18 are shown in FIG. 2 as representative examples of the movable mirrors and the interferometers, respectively. That is, in this embodiment, a stationary coordinate system (rectangular coordinate system) defining the movement position of the wafer stage WST is defined by length measuring axes of the Y interferometer and the X interferometer of the wafer laser interferometer system 18. In the following description, the stationary coordinate system is called a stage coordinate system. The end of the wafer stage WST may be polished into a mirror surface to serve as a reflection surface (which corresponds to the reflection surfaces of the Y movable mirror and the X movable mirror) of the interferometer beam.

Positional information (or velocity information) on the stage coordinate system of the wafer stage WST is supplied to the stage control unit 19 and to the main control device 20 through the stage control unit 19. The stage control device 19 controls the wafer stage driving unit 24 to drive the wafer stage WST, on the basis of the positional information (or velocity information) of the wafer stage WST, according to instructions from the main control device 20.

A reference mark plate FM is fixed in the vicinity of the wafer W on the wafer stage WST. The heights of the surface of the reference mark plate FM and the surface of the wafer W is the same. A reference mark for measuring a base line of an alignment system, a reference mark for reticle alignment, and other reference marks, which will be described later, are formed on the surface of the reference mark plate FM.

An alignment system AS of an off-axis type is fixed to the side of the projection optical system PL. For example, an FIA (field image alignment) sensor disclosed in Japanese Unexamined Patent Application Publication No. 2-54103 (which corresponds to U.S. Pat. No. 4,962,318) is used as the alignment system AS. The alignment system AS emits illumination light (for example, white light) having a predetermined wavelength range to the wafer, and condenses the image of the alignment mark on the wafer and the image of an index mark on an index plate provided in a conjugate plane of the wafer on the light receiving surface of an image capturing element (for example, a CCD camera) by using an object lens, thereby detecting the images. The alignment system AS outputs the captured image of the alignment mark (and the reference mark on the reference mark plate FM) to the main control device 20. As long as the domestic statutes of designated states (or selected states) of this international application permit, the entire disclosure of Japanese Unexamined Patent Application Publication No. 2-54103 and U.S. Pat. No. 4,962,318 corresponding thereto is hereby incorporated by reference herein in its entirety.

In the exposure apparatus $100_1$, a multipoint focus detection system of oblique incidence type composed of an illumination optical system (not shown) for supplying luminous flux which form a plurality of slit images toward the best imaging surface of the projection optical system PL in an oblique direction with respect to the optical axis AX and a photoreceiver optical system (not shown) for receiving the luminous flux reflected from the surface of the wafer W through slits are fixed to a supporting member (not shown) for supporting the projection optical system PL. For example, a multipoint focus detection system disclosed in Japanese Unexamined Patent Application Publication No. 6-283403 (which corresponds to U.S. Pat. No. 5,448,332) is used as the multipoint focus detection system, and the stage control device 19 controls the wafer stage driving unit 24 to minutely drive the wafer stage WST in the Z-axis direction and the oblique directions (the θx direction and the θy direction) on the basis of the positional information of the wafer from the multi-point focus detection system, thereby controlling the focus leveling of the wafer W. As long as the domestic statutes of designated states (or selected states) of this international application permit, the entire disclosure of Japanese Unexamined Patent Application Publication No. 6-283403 (which corresponds to U.S. Pat. No. 5,448,332) is hereby incorporated by reference in its entirety.

As shown in FIG. 2, the exposure apparatus 100₁ further includes a sensor that detects information on an environmental variation before and after the wafer W is loaded into the exposure apparatus, for example, a humidity sensor HS that measures the humidity in the exposure apparatus, and a temperature sensor TS, such as an infrared sensor for measuring the temperature of the wafer W before and after the wafer W is loaded on the wafer stage WST. The temperature sensor TS detects, for example, the temperature of the wafer W immediately after the wafer W is loaded from the C/D into the exposure apparatus 100₁ and the temperature of the wafer W immediately after the wafer W is loaded on the wafer holder 25 and held by the wafer holder 25. Information on the temperature detected by the temperature sensor TS is sent to the main control device 20.

The main control device 20 includes a microprocessor or a workstation, and generally controls all components of the apparatus. The main control device 20 is connected to the LAN 160. The main control device 20 includes a CPU for executing various types of programs for controlling the operation of the exposure apparatus, an internal memory for storing the programs and various types of data, and a storage device, which are not shown. In the exposure apparatus 100₁ having the above-mentioned structure, the main control device 20 controls the stage control device 19 to move the wafer stage WST in a stepping movement according to the stage coordinate system. In addition, under the control of the main control device 20, the illumination light IL emitted from the illumination system 10 passes through the reticle R and the projection optical system PL so that a reduced image (a partial image) of the circuit pattern of the reticle R in the radiated area (the above-mentioned illumination area) of the illumination light is formed on the wafer W having a resist (photosensitive agent) on the surface thereof, while the reticle stage RST and the wafer stage WST are synchronously scanned in the Y-axis direction at a speed ratio corresponding to a projection magnification, so that a plurality of shot areas having the circuit pattern of the reticle R transferred thereonto are formed in a matrix on the wafer W.

The shot areas on the wafer W are formed by pattern transfer on the basis of design information set beforehand (which is designated within a process program to be managed by the host 150. The process program is a configuration file having exposure conditions such as a sequence of manufacturing a semiconductor device to be manufactured using an exposure apparatus, and various types of data (for example, exposure parameters and alignment parameters) set therein). In this embodiment, the design information is called a shot map. In order to form each shot area, the exposure apparatus 100₁ refers to coordinates of the shot area in the design that is included in the shot map (the position of each shot area formed on each layer from the second and subsequent layers is corrected from the position of the shot area in the design on the basis of the position of the center of the shot area formed on a previous layer by means of wafer alignment, which will be described later). As such, since the shot areas are formed in a matrix on the wafer W according to the shot map, it is possible to draw a two-dimensional grid by connecting the center of each of shot areas having being formed on the wafer W in a straight line between adjacent shot areas. Hereinafter, the two-dimensional grid is referred to as a wafer grid. In this embodiment, the wafer grid is a standard for the positions of the shot areas formed on the wafer W, and makes it possible to represent an inter-shot error. The inter-shot error means a positional error among a plurality of shot areas formed on the wafer with respect to positions in the design, and also means an error between the arrangement of the shot areas in the design and the actual arrangement thereof. A so-call intra-shot error caused by the deformation of the shot areas is excluded from the inter-shot error. The inter-shot error includes a primary component (that is, a linear component) such as a wafer magnification error, a wafer orthogonality error and a wafer rotation error and a high-order component of a secondary component or more (that is, a non-linear component). The primary component means a component capable of being approximated to a primary term of coordinate axes X and Y of a stage coordinate system (an XY coordinate system), and the high-order component means a component capable of being approximated to a function that is represented by a linear combination of terms having each of $X^2, XY, Y^3, X^3, X^2Y, XY^2$, and $Y^3$ as an independent variable.

The stage coordinate system is ideally a complete orthogonal linear coordinate system. However, actually, the stage coordinate system is not completely orthogonal, but has a little non-linearity. For explanation the orthogonality and the non-linearity of the stage coordinate system, a two-dimensional grid defined by the stage coordinate system (XY coordinate system) is defined, similar to the wafer grid. Hereinafter, the two-dimensional grid is referred to as a stage grid. In general, the wafer grid formed on the wafer W is affected by the orthogonality and the non-linearity of the stage grid of the exposure apparatus forming the shot areas by pattern transfer, and the orthogonality and the non-linearity of the stage grid is a main factor causing an error in the wafer grid.

Next, factors causing the error in the wafer grid will be described. The factors causing the error in the wafer grid include the thermal expansion of a wafer, an error in the stage grid between the exposure apparatuses, and the deformation of a wafer generated during a process. Among them, a linear component, such as a orthogonality component of an error in the stage grid, and the thermal expansion of a wafer mainly contributes to a linear component of the error between shot areas, and a non-linear component of an error in the stage grid and a local deformation of a wafer generated during a process contributes to a non-linear component of the error between shot areas.

The exposure apparatus 100₁ has a grid correcting function of correcting the position of the wafer W in consideration of a non-linear component of the error between shot areas, in addition to the EGA wafer alignment function, which will be described later, of canceling a linear component of the error between shot areas.

The EGA wafer alignment function uses the alignment system AS to measure wafer marks provided in several shot areas (sample shot areas) on the wafer W that are previously selected (this measurement is particularly referred to as EGA measurement), and calculates coordinates of the sample shot areas in the stage coordinate system. Then, the EGA wafer alignment function performs a statistical operation using a least square method that is disclosed in U.S. Pat. No. 4,780,617, on the basis of the calculated coordinates of the sample shot areas and the coordinates thereof in the design, to estimate EGA parameters, such as the magnification, the rotation, and the offset of the wafer grid, and generates a model formula indicating the positional deviation between coordinates of the center of the shot area in the design, which is defined by the calculated EGA parameters, and the actual coordinates of the center of the shot area. Then, the EGA wafer alignment function calculates coordinates of all the shot areas (arrangement coordinates) as the positions of the actual shot areas, on the basis of the model formula and the coordinates of the center of the shot area in the design. This estimated operation is called an EGA operation. An example of the model formula is represented by Equation given below:

$$dx = a_0 + a_1 \cdot x + a_2 \cdot y$$

$$dy = b_0 + b_1 \cdot x + b_2 \cdot y \quad \text{[Equation 1]}$$

In Equation 1, (dx, dy) indicates the positional deviation, and is a linear component in this embodiment. In addition, (x, y) indicates coordinates of the center of the shot area in the design, and $a_0$ to $a_2$ and $b_0$ to $b_2$ are coefficients having magnitude corresponding to the linear component. In the statistical operation, the coefficients $a_0$ to $a_2$ and $b_0$ to $b_2$ allowing the square of a residual error of the positional deviation (which is referred to as ($\Delta x, \Delta y$)) between the actual coordinates of the center of the sample shot area and the coordinates of the center of the sample shot area in the design with respect to the positional deviation (dx, dy) to be the minimum are calculated. The coefficients $a_0$ to $a_2$ and $b_0$ to $b_2$ of the linear component correspond to the EGA parameters.

The grid correcting function premises that the EGA wafer alignment is performed, the grid correcting function extracts a non-linear component of the inter-shot error, which is remaining even if the linear component calculated by the EGA wafer alignment has been deemed to be corrected and corrects the position of the center of the shot area to be formed by pattern transfer with respect to the extracted non-linear component. A residual error between the positional deviation ($\Delta x, \Delta y$) and the positional deviation (dx, dy) calculated by the model formula directly represents the non-linear component.

Since the non-linear component of the error between shot areas generally includes high-order components, such as a secondary component, a tertiary component, a quartic component, and so on, in order to completely extract the non-linear components, coordinates of all the shot areas on the wafer W loaded into the exposure apparatus $100_1$ may be measured by using the alignment system AS, and the EGA operation may be performed on the basis of the actual coordinates of all the shot areas to obtain the residual error in all the shot areas between the positional deviation ($\Delta x, \Delta y$) and the positional deviation (dx, dy) calculated by the model formula. However, this is not preferable from the viewpoint of throughput. Therefore, the exposure apparatus $100_1$ is provided with a plurality of grid correcting functions having different correction conditions for correcting the non-linear components of the error between shot areas. The grid correcting functions are classified into the following two main functions:

(1) A grid correcting function of measuring the positions of the shot areas on the head wafer W in the lot actually loaded into the exposure apparatus or a predetermined number of wafers W in the lot from the head wafer for extraction as a non-linear component of the error between shot areas (that is, measuring the positions of the shot areas in each lot in order to extract a non-linear component), extracting the non-liner component, and correcting the positions of the shot areas on the basis of the result of the extraction (first correction function); and (2) A grid correcting function of loading a reference wafer for overlay exposure into an exposure apparatus before exposure is actually performed, detecting the wafer grid of the reference wafer by using the alignment system AS, extracting a non-linear component of the error between shot areas on the basis of the result of the detection, and correcting the position of each shot area on the basis of the result of the extraction (second correction function).

In the second correction function, a wafer on which the arrangement of shot areas is formed by the exposure of any one of the exposure apparatus $100_1$ to $100_N$, which is a reference for overlay exposure in the lithography system 110, is used as the reference wafer. In this way, the extracted non-linear component becomes a non-linear component of an error in the stage grid between the exposure apparatuses, and thus it is possible to match the exposure apparatus with the exposure apparatus $100_1$. As a result, it is possible to realize overlay exposure which seems to align with the stage grid of the reference exposure apparatus. When a product wafer W to be exposed by the exposure apparatus $100_1$ is used as the reference wafer, it is possible to perform correction considering a non-linear component varying in each process. When the product wafer is not used as the reference wafer, it is preferable that extraction of the non-linear component is performed from a reference wafer having the same shot map as the product wafer.

The first correction function is effective when a large variation of the non-linear component occurs between lots in the exposure apparatus. However, in order to extract a non-linear component of the error between shot areas, it is necessary to increase the number of times the sample shot area is measured (the number of samples) at least for the head wafer of the lot. The second correction function can extract the non-linear component of the error between shot areas beforehand and does not need to additionally measure the sample shot area in order to extract the non-linear component from the head wafer in the lot. Therefore, the second correction function is advantageous from the viewpoint of throughput, but is difficult to cope with a variation in the non-linear component during a period from the extraction of the non-linear component to the actual exposure process. That is, in the second correction function, it is difficult to cope with a change in the stage grid or the deformation of the wafer W due to a process (for example, an increase in temperature when a resist is applied) during the period. When the second correction function is performed, it is necessary to manage the change in the stage grid and the like for a long time.

The second correction function can extract a non-linear component of the wafer grid from the wafer W actually exposed by the exposure apparatus $100_1$, and correct the position of the wafer W on the basis of the result of the extraction. However, in the first correction function, it is difficult to consider the result of the actual exposure performed by the exposure apparatus $100_1$. In addition, in the first correction function, since it is necessary to extract the non-linear component while the lot is processed, it is difficult to increase the number of times the shot areas are measured and thus to improve the reproducibility of measurement. However, in the second correction function, since the non-linear component is extracted beforehand, it is possible to increase the number of times the shot areas are measured and thus improve the reproducibility of measurement, without considering throughput.

As described above, the first correction function and the second correction function have different advantages. In this embodiment, the use of the first correction function or the second correction function is selected according to various conditions.

In this embodiment, the following two correction functions are prepared in addition to the first and second correction functions:

(3) A function using a correction-mathematical function having a predetermined order including a quadratic term or more that is obtained by approximating a non-linear component of an inret-shot error as correction information for correcting the position of the shot area (mathematical function correcting function); and (4) A function using a correction map, which is a set of non-linear components of shot areas corresponding to the non-linear components of an inter-shot error, as correction information for correcting the positions of the shot areas (map correcting function).

In the mathematical function correcting function of (3), for the same reason as EGA, it is possible to decrease the number of samples of shot areas to be measured, since a mathematical function is obtained by using a statistical method, which is advantageous from the viewpoint of throughput. However, it is difficult to correct the non-linear components of the inter-shot error higher than the order of the mathematical function. In the map correcting function or (4), the number of samples of necessary shot areas increases, but it is possible to correct high-order non-linear components that cannot be corrected by the mathematical function. The mathematical function correcting function has an advantage in that the mathematical function is made by for example the least square method, which makes it possible to cover a reduction in the number of measurements having an effect on the reproducibility of measurement.

Figure 3A:
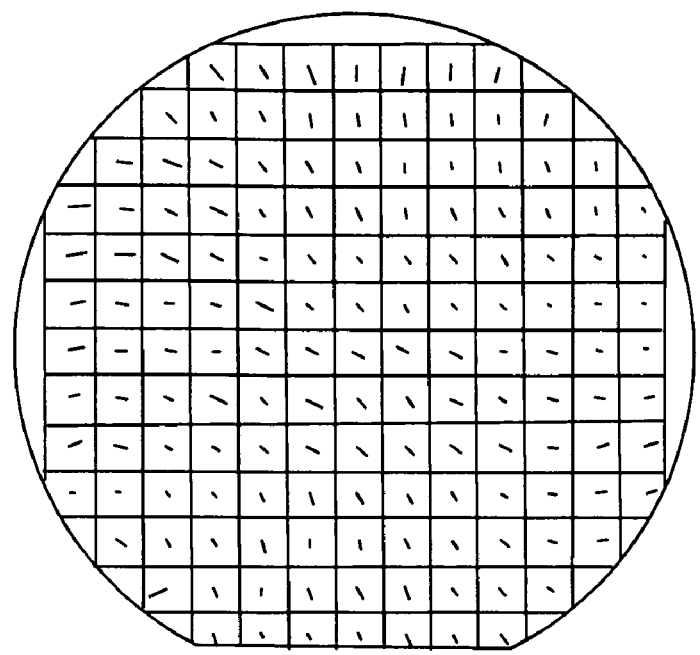
FIG. 3A is a diagram schematically illustrating a wafer W having non-linear components which should be corrected preferably by a correction function.
Figure 3B:
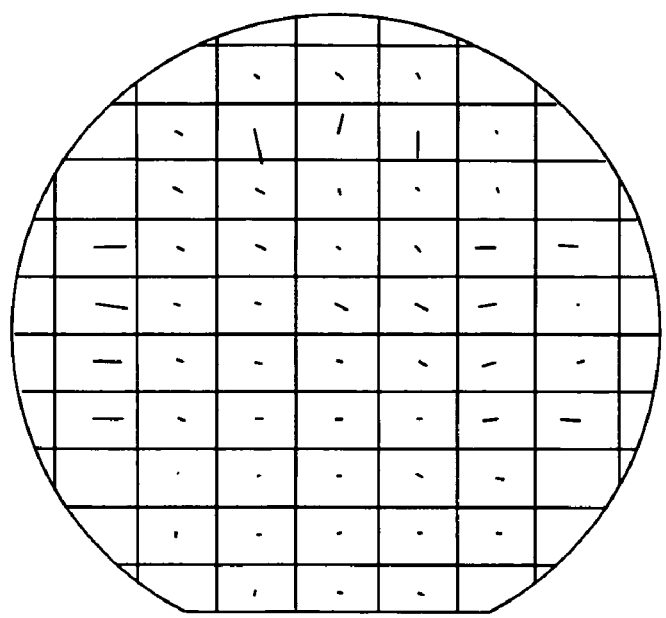
FIG. 3B is a diagram schematically illustrating a wafer W having non-linear components which should be corrected preferably by a correction map.

FIG. 3A is a diagram schematically illustrating a wafer having non-linear components of an error between shot areas, in which the mathematical function correcting function should be selected. FIG. 3B is a diagram schematically illustrating a wafer having non-linear components of an error between shot areas, in which the map correcting function should be selected. In FIGS. 3A and 3B, line segments indicating the directions and the magnitudes of non-linear components of an inter-shot error is drawn in each of the shot areas of the wafer W. In the wafer W shown in FIG. 3A, the non-linear components vary relatively smoothly between the shot areas. In this case, it is preferable to select the mathematical function correcting function using the correction-mathematical function as correction information. In contrast, in the wafer W shown in FIG. 3B, the non-linear components randomly vary between the shot areas. Therefore, it is considered that relatively high-order components are included in the non-linear components. In this case, it is preferable to select the map correcting function using a correction map as correction information.

In this embodiment, it is assumed that the highest order of a mathematical function used in the mathematical function correcting function is a cubic equation, and the mathematical function is represented by Equation 2 given below.

$$dx = a_0 + a_1 \cdot x + a_2 \cdot y + a_3 \cdot x^2 + a_4 \cdot x \cdot y + a_5 \cdot y^2 + a_6 \cdot x^3 + a_7 \cdot x^2 \cdot y + a_8 \cdot x \cdot y^2 + a_9 \cdot y^3$$

$$dy = b_0 + b_1 \cdot x + b_2 \cdot y + b_3 \cdot x^2 + b_4 \cdot x \cdot y + b_5 \cdot y^2 + b_6 \cdot x^3 + b_7 \cdot x^2 \cdot y + b_8 \cdot x \cdot y^2 + b_9 \cdot y^3 \quad \text{[Equation 2]}$$

In Equation 2, as in Equation 1, (dx, dy) indicates the positional deviation, (x, y) indicates coordinates of the center of the shot area in the design, and $a_0$ to $a_2$ and $b_0$ to $b_2$ are coefficients having magnitude corresponding to the linear component. In addition, $a_3$ to $a_9$ and $b_3$ to $b_9$ are coefficients of a quadratic term and a cubic term indicating non-linear components of a grid.

As described above, in the exposure apparatus $100_1$, a first mathematical function correcting function and a first map correcting function are prepared as the first correction function, and a second mathematical function correcting function and a second map correcting function are prepared as the second correction function. In this embodiment, one of the four functions is automatically selected according to conditions, which will be described later, and the selected correction function corrects the position of the wafer W when the shot areas are formed by pattern transfer on the wafer W. The CPU of the main control device 20 uses two flags to select a correction function. In this embodiment, the two flags are composed of an S-mode flag and a mathematical function mode flag. When the S-mode flag is set and the mathematical function mode flag is set, the main control device 20 selects the first mathematical function correcting function. When the S-mode flag is set and the mathematical function mode flag is reset, the main control device 20 selects the first map correcting function. When the S-mode flag is reset and the mathematical function mode flag is set, the main control device 20 selects the second mathematical function correcting function. When the S-mode flag is reset and the mathematical function mode flag is reset, the main control device 20 selects the second map correcting function. In this embodiment, when one of the four correction functions is selected, two flags are used. However, two flags are not necessarily used, and information (at least 2-bit information) capable for selecting the four correction functions may be prepared.

For a portion of the second correction function, since it is necessary to hold the beforehand extracted non-linear components of an error between shot areas, it is possible to set coefficients of the correction-mathematical function as constants of the exposure apparatus $100_1$. The correction of the grid correcting function additionally corrects the positional deviation of the arrangement coordinates, which is the estimated result of the EGA wafer alignment. Therefore, the linear component estimated by the EGA wafer alignment function may be slightly different from each other according to the selection of a sample shot area, even when the same process is performed on wafers, which causes the non-linear components to be extracted by the grid correcting function to vary. Therefore, in this embodiment, in a storage device (not shown), for all combinations of shot map data and the selection of sample shot areas that is likely to be used by the exposure apparatus $100_1$, a coefficient of each term of a mathematical function having a predetermined order (for example, a cubic equation) can be set as a constant of the exposure apparatus. The Coefficient is obtained by approximating non-linear components of the positional deviation from a reference position (for example, a design position) of each shot area on the wafer W. In the second mathematical function correcting function, shot map data of a product wafer and coefficients of the correction-mathematical function, which are constants of the exposure apparatus corresponding to the sample shot areas to be used for the EGA operation may be read from the storage device.

In addition, the correction map may be stored as the apparatus constant. However, since storage capacity required to store the correction map is larger than coefficients of the correction-mathematical function, in this embodiment, only the coefficients of the correction-mathematical functions are stored as the apparatus constants, and the correction map is stored in another component of the lithography system 110. Then, information on the correction map is sent to the exposure apparatus $100_1$, whenever necessary.

In a method of making the correction map in the first and second map correction functions, a reference wafer is prepared, and marks on the reference wafer are measured. Then, the correction map is made on the basis of the result of the measurement of the marks. This method is disclosed in detail in U.S. Published Application No. 2002/0042664, and thus a detained description thereof will be omitted in this embodiment. The correction-mathematical function in the second mathematical function correcting function is created as follows. The error between shot areas extracted when the correction map is made as in U.S. Published Application No. 2002/0042664 is approximately calculated by mathematical function fitting to calculate the coefficients $a_1$ to $a_9$ and $b_1$ to $b_9$, and the coefficients are registered on a database of the central information server 130 as the constants of the exposure apparatus $100_1$.

Figure 4:
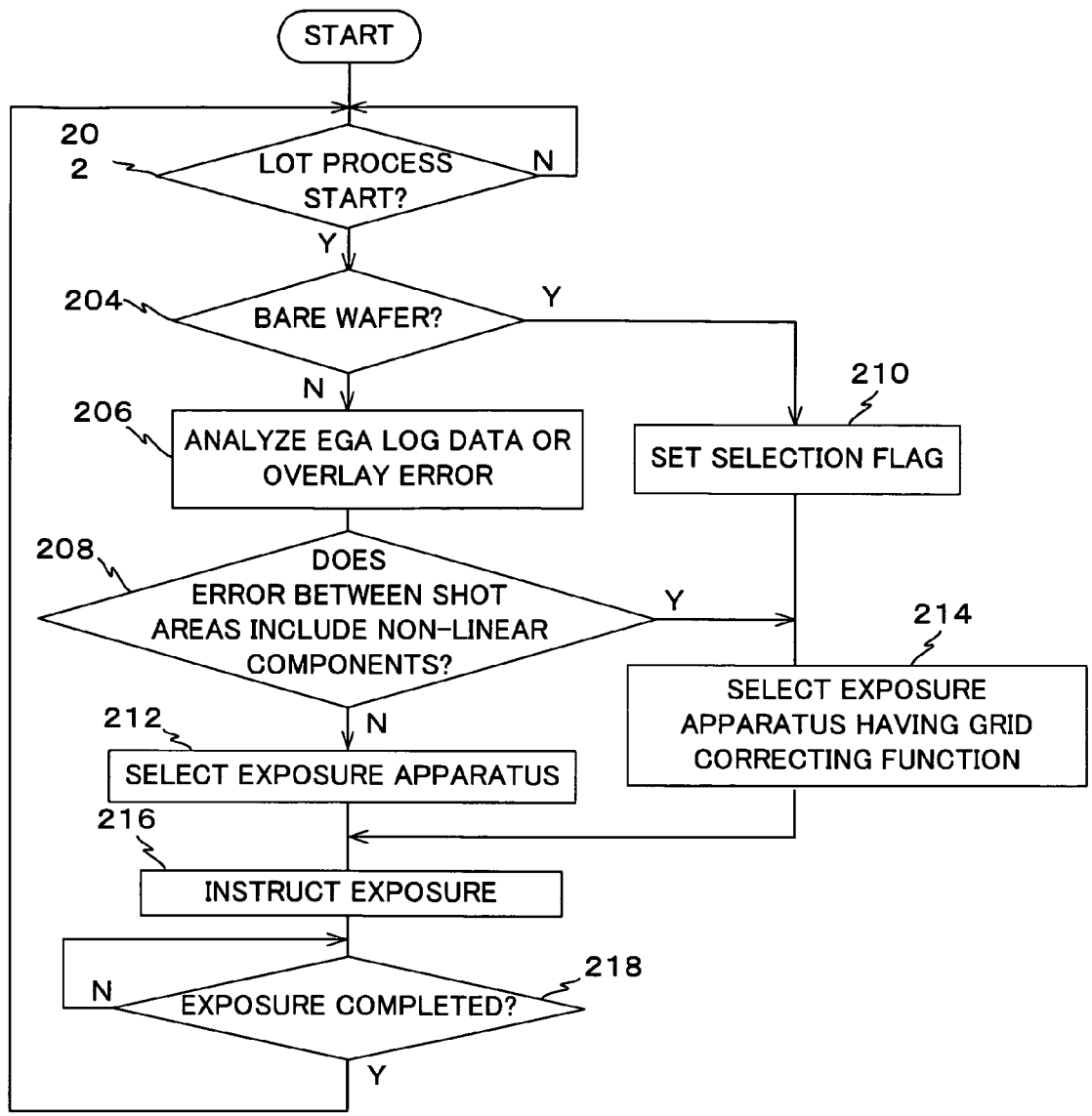
FIG. 4 is a flowchart schematically illustrating a process algorithm related to a wafer exposure process performed by a host computer.

Next, a wafer exposure process by the lithography system 110 according to this embodiment will be described with reference to FIGS. 4 to 11. FIG. 4 is a flowchart illustrating an algorithm related to a wafer exposure process by the host 150 of the lithography system 110.

In the exposure process algorithm shown in FIG. 4, it is assumed that the wafers W are managed in each lot by the central information server 130, and the exposure apparatuses $100_1$ to $100_N$ log exposure history data including information capable of analyzing the exposure state of the wafer W. The exposure history data includes, for example, a process/program name and a lot name when exposure commands are processed. The exposure history data of the wafer W is sent from the exposure apparatus 100i to the central information server 130 whenever necessary (periodically). The central information server 130 stores overlay error information of the pilot wafer that is subjected to the same process as the wafer W in the lot to be exposed measured by the overlay measuring instrument 120 as the exposure history data in association with the lot name, etc.

In the process program, a mathematical mode flag is set as one of the alignment parameters in the process program. The mathematical mode flag is information for determining whether the correction-mathematical function or the correction map is used as a correction information for correcting the non-linear components of the inter-shot error, the correction information is applied to multi-lot grid correction of subroutine 508 (see FIG. 7 and which will be described later). When the flag is set, the correction-mathematical function is used as the correction information. When the flag is reset, the correction map is used as the correction information.

The process program includes a correction information file name, which is one of the alignment parameters, and correction information in the file is used as the above correction information. In a case in which the correction-mathematical function is used as the correction information, when the correction information in the file is coefficients of the correction-mathematical function, the coefficients are used. However, when the correction information in the file is a correction map, the main control device 20 performs mathematical function fitting on a non-linear component of the correction map to calculate a correction-mathematical function and uses coefficients of the correction-mathematical function. Meanwhile, when the correction map is used as the correction information, the correction information in the file becomes the correction map. When the second map correcting function is selected, the correction map in the file is used as correction information.

When the second mathematical function correcting function is selected and a correction-mathematical function is used as correction information, the process program also includes information for determining whether to apply coefficients of the correction-mathematical function set as apparatus constants or correction information of coefficients of the correction-mathematical function in the correction information file designated by the process program.

As shown in FIG. 4, first, at Step 202, the host 150 determines whether conditions to start the process of a wafer W in a lot to be exposed are satisfied. Then, when the conditions to start the process of the wafer W in the lot are satisfied, the host 150 determines at Step 204 whether the wafer W of the lot to be exposed is a bare wafer that is not exposed (a wafer without layers on which patterns are formed, of which first layer will be exposed (formed)). When it is determined that the wafer W is the bare wafer, the host 150 performs Step 210 to set a selection flag for selecting multi-lot grid correction of the subroutine 508 (see FIG. 7), which will be described later, as the second correction function. That is, when the selection flag is set, the bare wafer becomes a wafer to be exposed.

On the other hand, when it is determined at Step 204 that the wafer W is not the bare wafer, the host 150 performs the next Step 206 to read EGA log data of the wafer in the lot to be exposed or overlay error information from the central information server 130 through the terminal server 140 and the LAN 160 and analyze it. At Step 208, the host 150 determines whether an error between shot areas on the wafer W of the lot includes a non-linear component exceeding a predetermined value on the basis of the result of the analysis.

When it is determined at Step 208 that the inter-shot error does not include the non-linear component exceeding the predetermined value, that is, when the inter-shoto error exists, but includes a substantially linear component (for example, a wafer magnification error, a wafer orthogonality error, and a wafer rotation error) and a negligible non-linear component, the process proceeds to Step 212. At Step 212, the host 150 selects an appropriate exposure apparatus $100_i$ from all the exposure apparatuses $100_1$ to $100_N$ in the lithography system 110 as an exposure apparatus for exposing the wafer W of the lot. For the purpose of simplicity of explanation, it is assumed that an exposure apparatus without a grid correcting function is selected in this embodiment.

On the other hand, when it is determined at Step 208 that the inter-shot error includes the non-linear component exceeding the predetermined value, the host 150 performs Step 210 and proceeds to Step 214 to select an exposure apparatus having the grid correcting function. In this embodiment, it is assumed that the exposure apparatus $100_1$ is selected.

After completing Steps 212 and 214, the host 150 instructs the main control device of the selected exposure apparatus to perform exposure. In this case, the host 150 issues an exposure command to the main control device of the exposure apparatus. The exposure command includes a command to designate a process program name corresponding to setting designation information of exposure conditions. Then, the host 150 performs Step 218 to wait for the exposure process of the wafer W of the lot to be completed.

Then, when the exposure apparatus $100_1$ instructed to perform exposure at Step 216 sends a notice of the completion of exposure to the host 150, the host 150 determines that the process of the lot is completed and returns to Step 202 to wait for conditions to restart the process of a wafer W in the lot to be satisfied. When the conditions to restart the process of the wafer W in the lot are satisfied, the host 150 repeats the processes after Step 204. That is, in this way, the host 150 performs a loop process shown in the flowchart of FIG. 4 on each of a plurality of lots and repeats a process (loop process) related to wafers of each of the lots.

<Exposure Process of Exposure Apparatus $100_1$>

Figure 5:
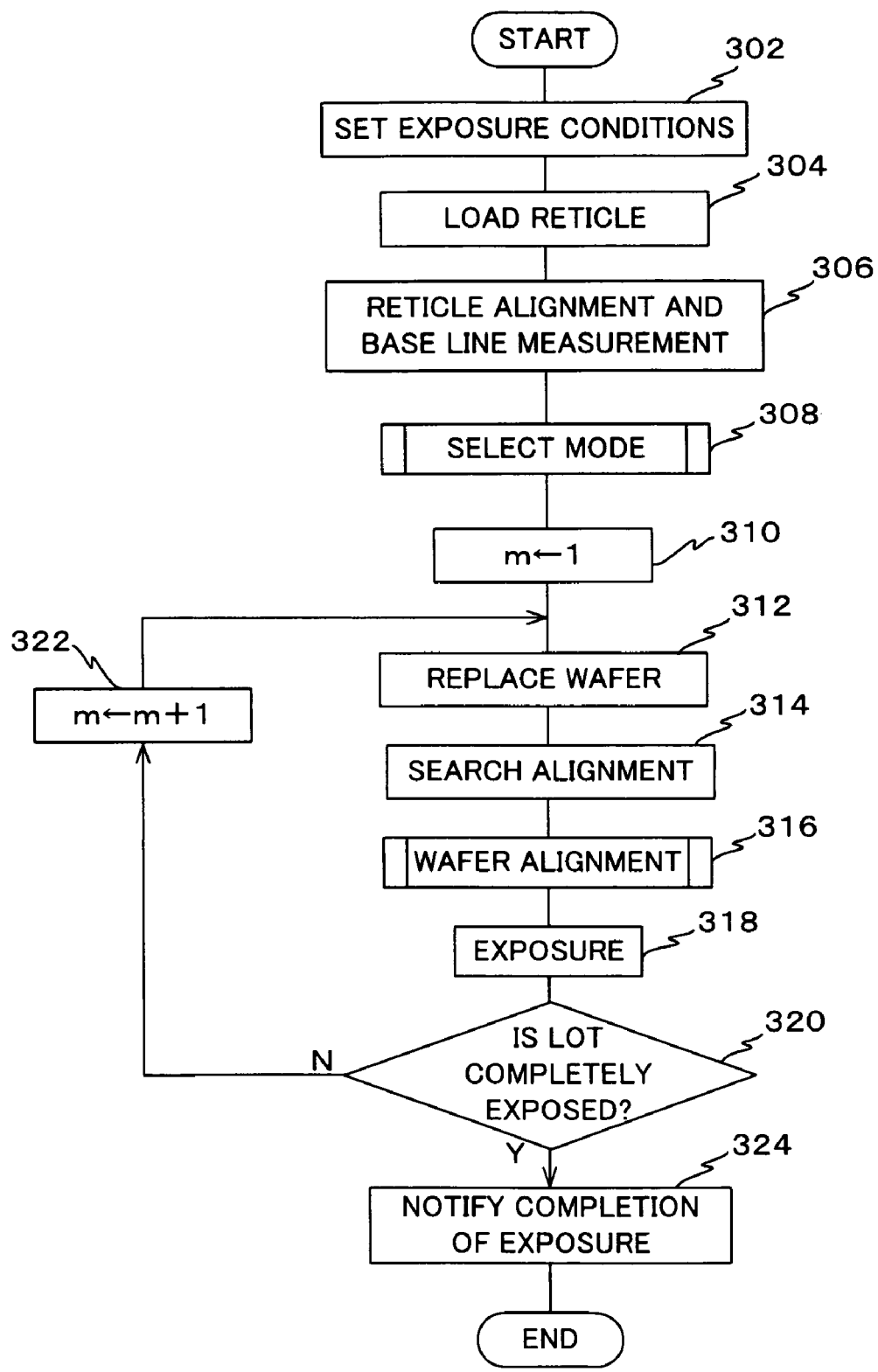
FIG. 5 is a flowchart schematically illustrating a main process algorithm of a main control device of an exposure apparatus that receives an exposure instruction from the host computer at Step 208 of FIG. 4.

The main control device 20 of the exposure apparatus $100_1$ receiving an exposure command from the host 150 at Step 216 performs a process according to a process algorithm shown in a flowchart of FIG. 5.

First, at Step 302, the main control device 20 acquires a process program file from the central information server 130 on the basis of a process program name designated at Step 216 by the host 150 and sets exposure conditions according to the process program file. In the next Step 304, the main control device 20 controls a reticle loader (not shown) to load the reticle R on the reticle stage RST. At the next Step 306, the main control device 20 uses the reference mark plate FM to measure the base line of the alignment system AS and reticle alignment. The measurement of the base line causes the positional relationship between the projection center of the pattern on the reticle R and the alignment system AS to be clearly established. A method of measuring the base line is disclosed in, for example, Japanese Unexamined Patent Application Publication No. 7-176468 (which corresponds to U.S. Pat. No. 5,646,413) and thus a detailed description thereof will be omitted. When the measurement of the base line of the alignment system AS and the reticle alignment is completed, the process proceeds to Step 308. As long as the domestic statutes of designated states (or selected states) of this international application permit, the entire disclosure of Japanese Unexamined Patent Application Publication No. 7-176468 (which corresponds to U.S. Pat. No. 5,646,413) is hereby incorporated by reference in its entirety.

Figure 6:
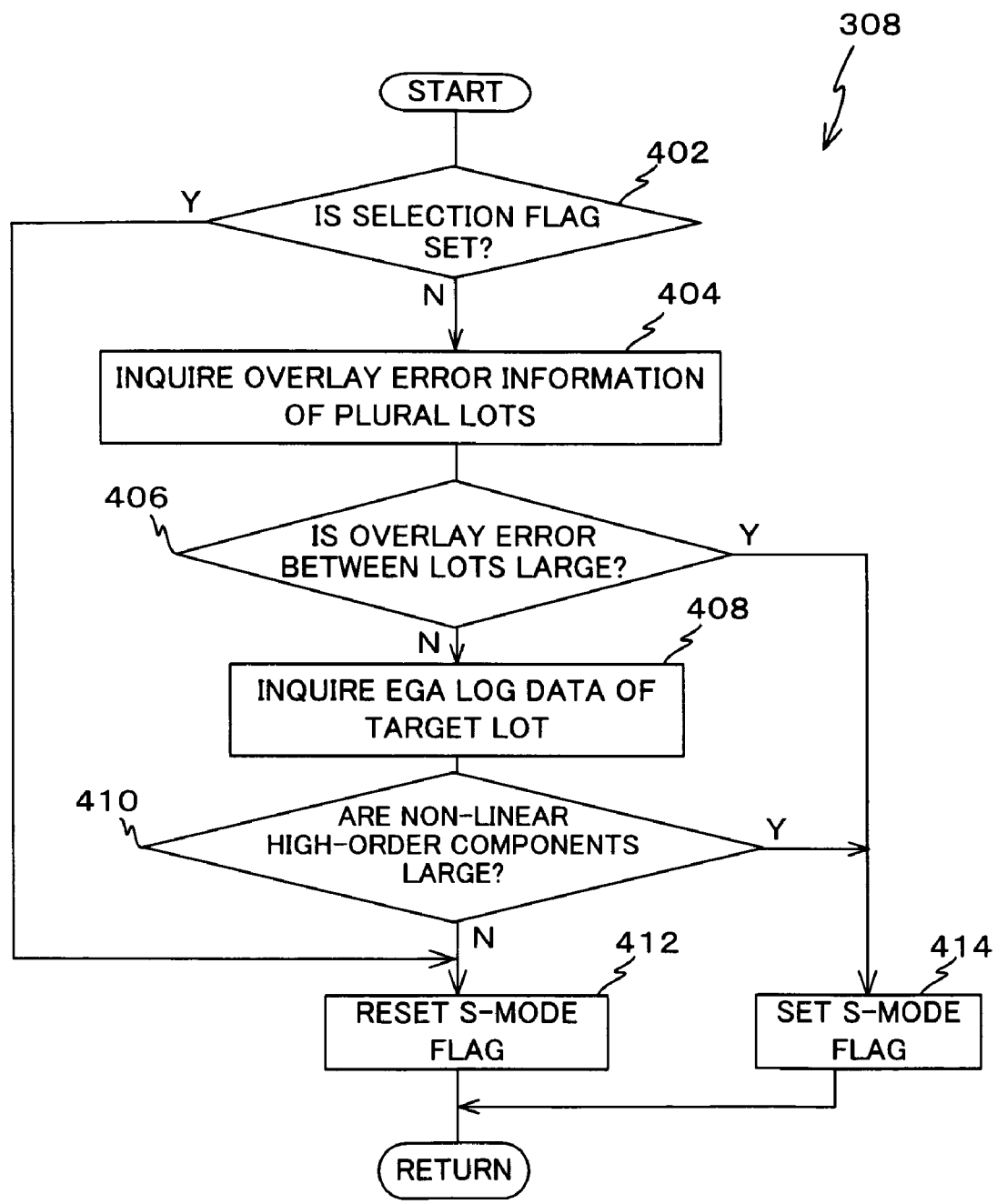
FIG. 6 is a flowchart illustrating a detailed process algorithm of a subroutine 308 of FIG. 5.

At the next Step 308, the main control device 20 sets a flag for selecting a grid correcting function, that is, the S-mode flag, which is a flag for determining whether to perform single lot grid correction in a subroutine 506 (see FIG. 7), which will be described later, as the first correction function or multi-lot grid correction in the subroutine 508 (see FIG. 7), which will be described later, as the second correction function. When the S-mode flag is set, the single lot grid correction is selected in wafer alignment, which will be described later. If not, the multi-lot grid correction is selected. FIG. 6 is a flowchart illustrating the process of the subroutine 308. As shown in FIG. 6, first, at Step 402, the main control device 20 determines whether a selection flag is set in the acquired process program. When the selection flag is not set in the acquired process program, the process proceeds to Step 404. On the other hand, when the selection flag is set in the acquired process program, the process proceeds to Step 412. At Step 402, it is determined whether one or more layers of a wafer in a lot to be exposed are exposed or the wafer in the lot is a bare wafer. When the wafer is the bare wafer, the process proceeds to Step 412 to reset the S-mode flag.

At the next Step 404, the main control device 20 inquires the overlay error information of wafers in a plurality of lots before and after the lot to be exposed by the exposure apparatus of the central information server 130 through the LAN 160. Then, at the next Step 406, the main control device 20 compares a overlay error between a continuous series of lots with a predetermined threshold value on the basis of the overlay error information of the plurality of lots acquired from the central information server 130 in response to the inquiry and determines whether the overlay error is larger than the predetermined threshold value. When it is determined that the overlay error is not larger than the predetermined threshold value, the main control device 20 performs Step 408. On the other hand, when the overlay error is larger than the predetermined threshold value, the main control device 20 performs Step 414 to set the S-mode flag.

At Step 408, the main control device 20 inquires information on EGA until the previous layer of the wafer in the lot to be exposed of the central information server 130. At Step 410, the main control device 20 determines whether high-order components of the non-linear characteristics of the lot are large on the basis of, for example, information on a random error among information items on EGA acquired from the central information server 130 in response to the inquiry. As the result of the determination, when the high-order components of the non-linear characteristics of the lot are large, the main control device 20 performs Step 414 to set the S-mode flag. On the other hand, when the high-order components of the non-linear characteristics of the lot are not large, the main control device 20 performs Step 412 to reset the S-mode flag. After Step 412 or 414 is completed, the process of the subroutine 308 ends.

That is, in the subroutine 308, when the first layer of a wafer is completely exposed and the overlay error between lots or high-order components of the non-linear components in EGA log data are large, the S-mode flag is set. If not (when the wafer is a bare wafer or overlay error between lots and non-linear components in EGA log data are small), the S-mode flag is reset.

Further, the conditions to set the S-mode flag are not limited to the above. When another lot that is subjected to the same process as the present lot and is processed by the exposure apparatus $100_1$ has existed, the main control device 20 acquires information on random errors of EGAs of other lots in the exposure apparatus $100_1$ from the central information server 130 and determines whether a variation in random error between wafers in other lots is larger than a predetermined threshold value. As the result of the determination, when the variation in random error is larger than the predetermined threshold value, the S-mode flag may be set. Alternatively, a variation in random error between wafers of the present lot may be measured beforehand. In this case, when the variation in random error is large, the S-mode flag may be set.

Returning to FIG. 5, at the next Step 310, the main control device 20 initializes a count value m of a counter (not shown) indicating the order (that is, a wafer number in the lot) of the wafer W to be exposed in a lot (for example, one lot is composed of 25 wafers) to 1 (m←1). During these processes, when the wafer W having a resist applied by the coater/developer, which is the head wafer of the lot, is loaded into the exposure apparatus $100_1$, the main control device 20 acquires information on the temperature of the wafer W detected by a temperature sensor TS and stores the information in an internal memory. In this way, the main control device 20 controls the temperature sensor TS to detect the temperature of the second wafer W and the subsequent wafers whenever the wafer W is loaded into the exposure apparatus $100_1$.

At the next Step 312, the main control device 20 controls the wafer loader (not shown) to replace the exposed wafer W on the wafer holder 25 shown in FIG. 2 with a wafer W to be exposed. However, when there is no exposed wafer W on the wafer holder 25, the main control device 20 controls the wafer loader to load a wafer to be exposed on the wafer holder 25. The main control device 20 acquires information on the temperature of the wafer W detected by the temperature sensor TS and stores the information in the internal memory. In this way, the main control device 20 controls the temperature sensor TS to detect the temperature of the second wafer and the subsequent wafers W whenever the wafer is loaded onto the wafer stage WST. At the next Step 314, the main control device 20 performs search alignment on the wafer W loaded on the wafer holder 25. More specifically, for example, the main control device 20 controls the alignment system AS to detect at least two search alignment marks (hereinafter, referred to as search marks) that are arranged at the circumferential edge of the wafer W so as to be substantially symmetric with respect to the center of the wafer W. The detection of the two search marks is performed by sequentially positioning the wafer stage WST such that the two search marks are within the detection viewing angle range of the alignment system AS and by setting the magnification of the alignment system AS to a lower level. The main control device 20 calculates coordinates of the two search marks in the stage coordinate system on the basis of the result detected by the alignment system AS (the relative positional relationship between the center of the alignment system AS and each of the search marks) and the value measured by the wafer interferometer system 18 when each search mark is detected. Then, the main control device 20 calculates the remaining rotation error of the wafer W from coordinates of the two search marks, and minutely rotates the wafer holder 25 such that the remaining rotation error is approximately zero. In this way, the search alignment of the wafer W is completed.

Figure 7:
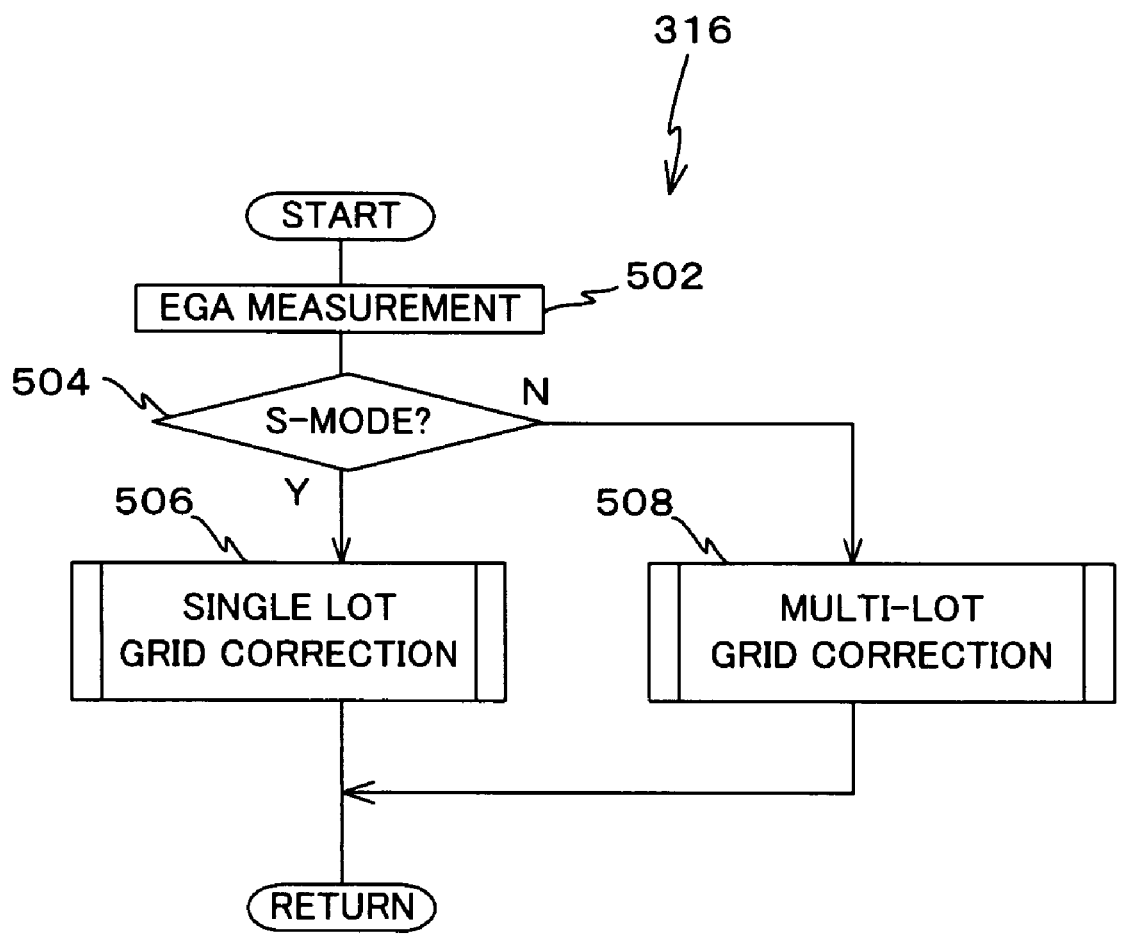
FIG. 7 is a flowchart illustrating a detailed process algorithm of a subroutine 316 of FIG. 5.

In the next subroutine 316, the main control device 20 performs wafer alignment. FIG. 7 is a flowchart illustrating a wafer alignment process. As shown in FIG. 7, first, at Step 502, the main control device 20 measures coordinates of a plurality of sample shot areas that are selected beforehand (a sufficient number of sample shot areas to accurately estimate linear, secondary, and cubic non-linear components of an inter-shot error). More specifically, similar to the above, the main control device 20 controls the alignment system AS (however, sets the magnification of the alignment system AS to a high level) to measure wafer marks provided in the plurality of shot areas (sample shot areas) that are selected beforehand on the wafer W, and finds coordinates of the sample shot areas in the stage coordinate system.

At the next Step 504, the main control device 20 determines whether the S-mode flag is set. As the result of the determination, when the S-mode flag is set, the main control device 20 performs single lot grid correction in the subroutine 506. On the other hand, when the S-mode flag is not set, the main control device 20 performs multi-lot grid correction in the subroutine 508. In the subroutine 308, it is assumed that the S-mode flag has been set.

<Single Lot Grid Correction>

Figure 8:
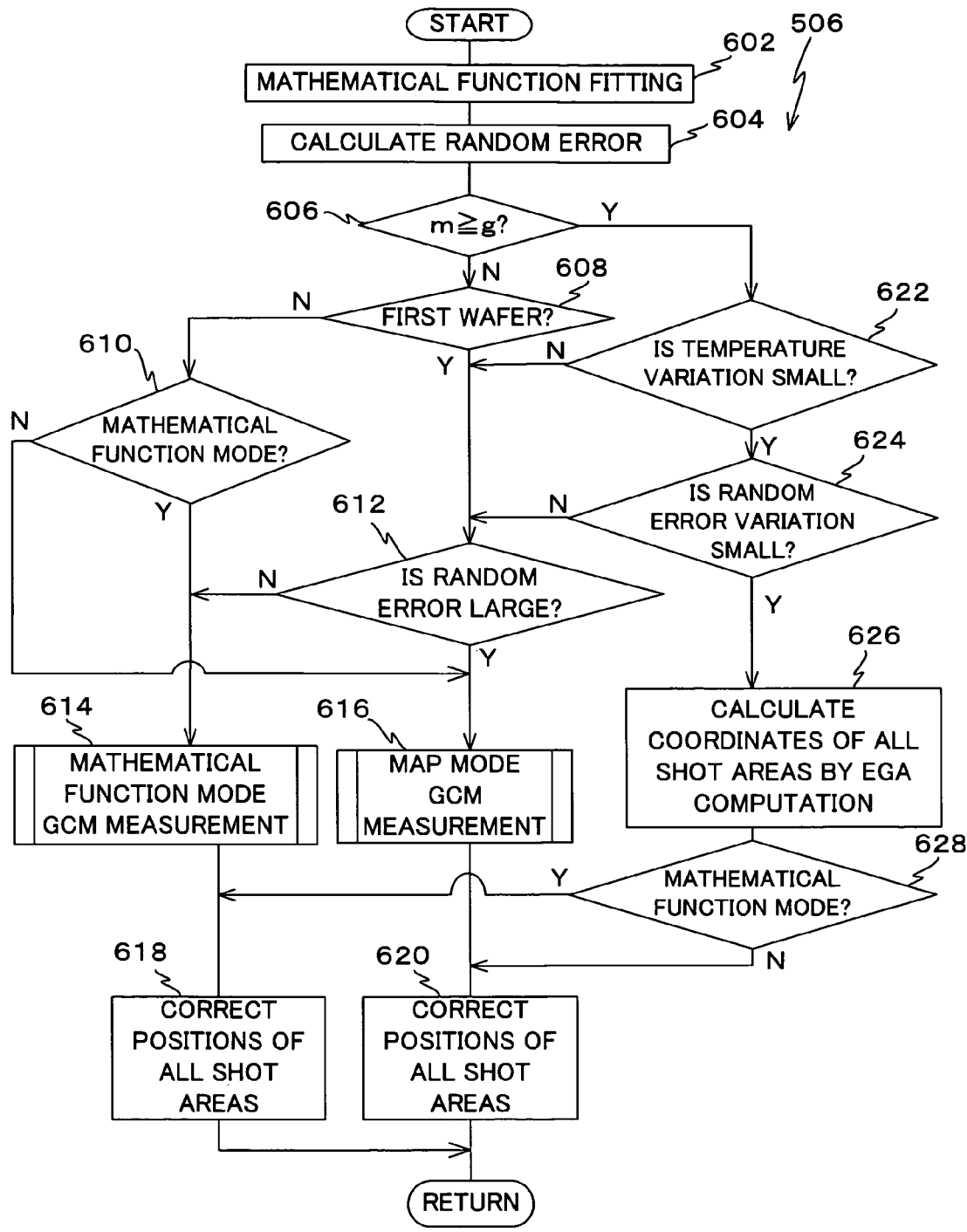
FIG. 8 is a flowchart illustrating a detailed process algorithm of a subroutine 506 of FIG. 7.

FIG. 8 is a flowchart illustrating the subroutine 506. As shown in FIG. 8, first, at Step 602, the main control device 20 performs mathematical function fitting of an inter-shot error with the mathematical function shown in Equation 2 on the basis of the measured result of EGA at Step 502 (that is, actual positional information of the sample shot areas), and calculates a square sum (random error) of the residual error of the positional deviation (which is referred to as ($\Delta x$, $\Delta y$)) between the actual coordinates of the center of the sample shot area and coordinates of center of the sample shot area in the design with respect to the positional deviation (dx, dy) calculated by Equation 2 at Step 604.

At the next Step 606, the main control device 20 determines whether the count value m of the counter is equal to or larger than a predetermined value g, thereby determining whether the wafer W on the wafer holder 25 (wafer stage WST) is a g-th wafer or a wafer subsequent to the g-th wafer in a lot. The predetermined value g is an integer that is equal to or larger than 2 and is equal to or smaller than 25. In the following description, for the purpose of simplicity of explanation, it is assumed that the predetermined value g is 3. In this case, since the wafer W is the head wafer (first wafer) of the lot, the count value m is set to 1 at the beginning. Therefore, it is determined at Step 606 that the count value m is smaller than the predetermined value g, and thus the main control device 20 performs Step 608 to determine whether the number of wafers is the first one. When it is determined at Step 608 that the number of wafers is the first one, the main control device 20 performs Step 612.

At Step 612, the main control device 20 determines whether the random error calculated at Step 604 is larger than a predetermined threshold value (which is referred to as a first threshold value). It is possible to set a value that is twice the step pitch of the wafer stage WST as the first threshold value. When it is determined that the random error is larger than the first threshold value, the main control device 20 performs a subroutine 616 for measuring a map mode GCM (grid compensation for matching) as the first map correcting function. On the other hand, when it is determined that the random error is smaller than the first threshold value, the main control device 20 performs a subroutine 614 for measuring a mathematical function mode GCM as the first mathematical function correcting function.

<Mathematical Function Mode GCM Measurement>

Figure 9:
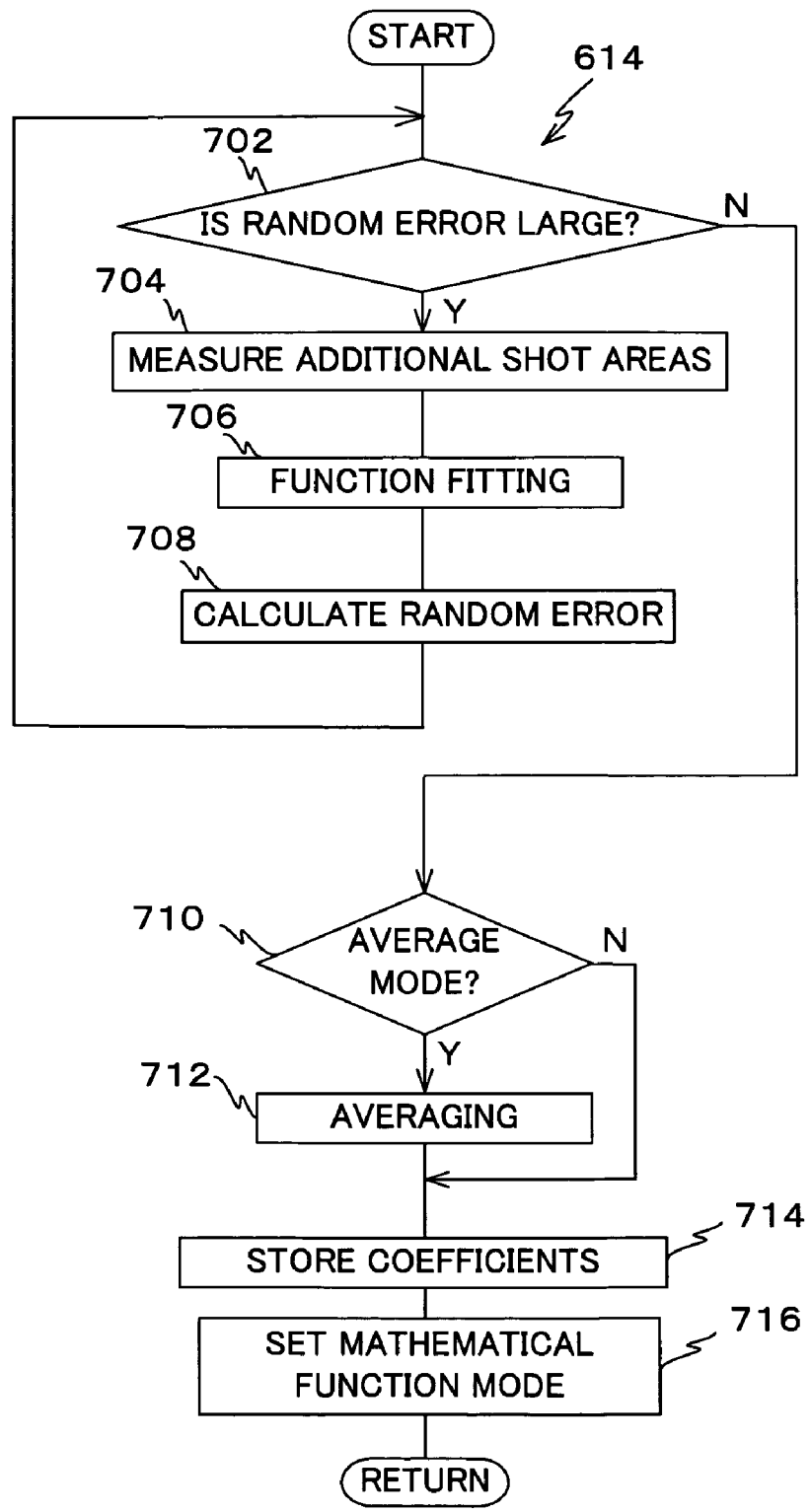
FIG. 9 is a flowchart illustrating a detailed process algorithm of a subroutine 614 (function mode GCM measurement) of FIG. 8.

FIG. 9 is a flowchart illustrating a subroutine 614 for mathematical function mode GCM measurement. As shown in FIG. 9, first, at Step 702, the main control device 20 determines whether the value of a random error is larger than a predetermined threshold value (which is referred to as a second threshold value). A value smaller than the first threshold value is set as the second threshold value. When it is determined that the value of the random error is not larger than the second threshold value, the main control device 20 performs Step 710. On the other hand, when the value of the random error is larger than the second threshold value, the main control device 20 performs Step 704. At Step 704, the main control device 20 measures an additional sample shot area. At Step 706, the main control device 20 performs mathematical function fitting using Equation 2, on the basis of the measured result of EGA performed at Step 502 and the measured result of the additional sample shot area, similar to Step 602, and calculates coefficients $a_0$ to $a_9$ and $b_0$ to $b_9$ of a function having a predetermined order that is obtained by approximately calculating an inter-shot error in the arrangement of the shot areas. At the next Step 708, the main control device 20 recalculates the square sum (random error) of the residual error when the newly calculated coefficients are used in Equation 2 and returns to Step 702.

Then, Steps 702, 704, 706, and 708 are repeatedly performed in this order until the value of the random error becomes smaller than the second threshold value. That is, until it is determined that the random error is smaller than the second threshold value, the measurement of an additional sample shot area is performed at Step 704, so that the number of sample shot areas increases. At Step 704, an arbitrary shot area can be an additional shot area, but it is preferable that sample shot areas be added so as to be uniformly distributed on the entire surface of the wafer W. In addition, it is possible to arbitrarily set the number of shot areas that are added at once.

When it is determined that the value of the random error is not larger than the second threshold value, the main control device 20 determines at Step 710 whether an average mode is set. The determination at Step 710 is performed on the basis of average mode setting parameters set as apparatus constants. When it is determined that the average mode is set, the main control device 20 performs Step 712. On the other hand, when it is determined that the average mode is not set, the main control device 20 performs Step 714. At Step 712, the main control device 20 reads the coefficients of the function which had been calculated for the wafer W in the lot (coefficients $a_0$ to $a_9$ and $b_0$ to $b_9$ in Equation 2) from the storage device, and calculates the average value of coefficients $a_0$ to $a_9$ and $b_0$ to $b_9$ of the terms including the coefficients $a_0$ to $a_9$ and $b_0$ to $b_9$ of the function obtained at Step 714, thereby obtaining averaged coefficients. Since the first wafer W is being loaded, the wafer W loaded beforehand does not exist, and thus no process is performed. After Step 712 is completed, or it is determined that the average mode is not set at Step 710, the main control device 20 performs Step 714 to store the coefficients $a_0$ to $a_9$ and $b_0$ to $b_9$ of the mathematical function (or the average values thereof) in a storage device (not shown). At the next Step 716, the mathematical function mode flag is set. After Step 716 is completed, the subroutine 614 ends.

<Map Mode GCM Measurement>

Figure 10:
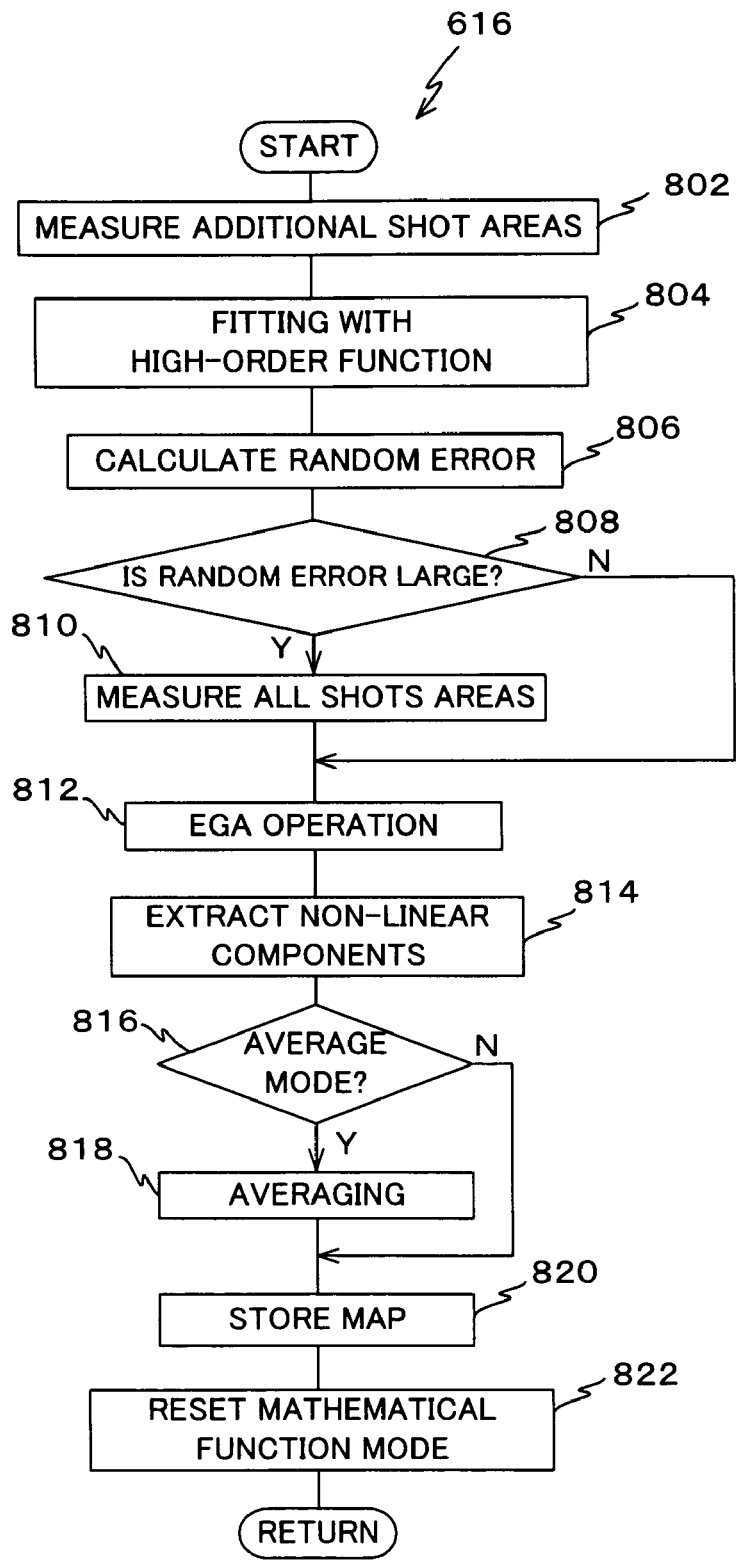
FIG. 10 is a flowchart illustrating a detailed process algorithm of a subroutine 616 (map mode GCM measurement) of FIG. 8.

Next, the map mode GCM measurement of the subroutine 616 will be described below. FIG. 10 is a flowchart illustrating the subroutine 616. As shown in FIG. 10, first, at Step 802, the main control device 20 measures additional sample shot areas. It is predetermined to set shot areas serving as the additional sample shot areas. For example, the sample shot areas are selected to be arranged in a check pattern, which makes it possible to obtain the uniform arrangement of sample shot areas on the wafer W, which is advantageous to an improvement in accuracy. At the next Step 804, the main control device 20 uses the measured results including the measured result of the additional sample shot areas and a higher-order function than the mathematical function shown in Equation 2 to perform the mathematical function fitting of the wafer grid by using a statistical method, such as a least square method, thereby obtaining coefficients.

At the next Step 806, the main control device 20 calculates the square sum of a residual error between coordinates corresponding to a correction-mathematical function for the sample shot areas in the calculated mathematical function and the actual coordinates, that is, a random error. At the next Step 808, the main control device 20 determines whether the random error is larger than a predetermined threshold value. When it is determined that the random error is larger than the predetermined threshold value, the main control device 20 performs Step 810 to measure the positions of all shot areas of the wafer W.

At Step 812 performed after Step 810 is completed or after it is determined at Step 808 that the random error is not larger than the predetermined threshold value, the main control device 20 performs an EGA operation again, using the actual positional information of the sample shot areas measured until now, to calculate EGA parameters in Equation 1. At the next Step 814, the main control device 20 extracts the residual error between the measured positional information of each sample shot area and coordinates corresponding to the positional deviation (dx, dy) in Equation 1, that is, non-linear components. A set of non-linear components is a correction map to be obtained.

At the next Step 816, the main control device 20 determines whether the average mode is set. When it is determined that the average mode is set, the main control device 20 performs Step 818. On the other hand, when it is determined that the average mode is not set, the main control device 20 performs Step 820. At Step 818, the main control device 20 reads the average value of the correction map calculated until now for the wafer W in the lot from a storage device (not shown), and calculates the average value of the correction amount (non-linear component) of each shot area calculated at Step 814, thereby averaging the correction map. After Step 818 is completed or after it is determined that the average mode is not set at Step 816, the main control device 20 performs Step 820 to store the correction map (map having the correction amount based on the non-linear components or the average value thereof) in the storage device. At the next Step 822, the mathematical function mode flag is reset. After Step 822 is completed, the subroutine 616 ends.

In this embodiment, at Step 808, when the random error is large, the main control device 20 immediately measures positional information of all shot areas at Step 810, but the invention is not limited thereto. For example, similar to the subroutine 614 shown in FIG. 9, the number of times the additional sample shot areas are measured may be gradually increased until the random error is included in the allowable range.

Referring to FIG. 8 again, after the subroutine 614 is completed, the main control device 20 performs Step 618 to substitute coordinates of each shot areas in the design into the correction function shown in Equation 2 whose all coefficients are determined, and calculates the positional deviation (dX, dY). Then, the main control device 20 corrects coordinates of all the shot areas on the basis of the positional deviation, and then completes the subroutine 506.

After the subroutine 616 is completed, the main control device 20 performs Step 620 to find the coefficients (EGA parameters) of Equation 1 obtained by the EGA operation. Then, the main control device 20 substitutes coordinates of each shot area in the design into the correction-mathematical function to calculate the positional deviation (dX, dY). Then, the main control device 20 corrects coordinates of all the shot areas by a positional deviation corresponding to a non-linear component of the shot area included in the correction map, and then completes the subroutine 506. After the subroutine 506 is completed, the main control device 20 completes the subroutine 316 shown in FIG. 7 and then performs Step 318 shown in FIG. 5.

At Step 318, the main control device 20 repeats an operation of sequentially stepping the wafer W to an acceleration start position (scanning start position) for exposing each shot area on the wafer W and an operation of transferring a reticle pattern onto the wafer W while synchronously moving the reticle stage RST and the wafer stage WST in the scanning direction, on the basis of arrangement coordinates of all the shot areas stored in a predetermined area of the internal memory, the overlay correcting position of each shot area corrected by the correction-mathematical function obtained by the subroutine 614 shown in FIG. 9 or the correction map obtained by the subroutine 616 shown in FIG. 10, and the base line measured beforehand, thereby performing an exposure operation by a step-and-scan method. In this way, exposure is completely performed on the head wafer W in the lot (the first wafer in the lot).

In the subroutine 616, in the shot area whose positional information is not measured, the residual error of the shot area is not calculated. In this case, the non-linear component of the shot area can be obtained by weighting calculation according to the Gaussian distribution, on the basis of the distance between the shot areas using several non-linear components in peripheral shot areas. The weighting calculation method is disclosed in U.S. Published Application No. 2002/0042664, and thus a detailed description thereof will be omitted.

At the next Step 320, the main control device 20 determines whether the count value m of the counter is greater than 24 in order to determine whether all wafers in a lot are completely exposed. In this embodiment, since m is 1, it is determined that the count value m of the counter is not greater than 24. Therefore, the main control device 20 performs Step 322 to increase the count value m of the counter (m←m+1), and returns to Step 312.

At Step 312, the main control device 20 controls the wafer loader (not shown) to replace the exposed head wafer of the lot on the wafer holder 25 shown in FIG. 2 with a second wafer of the lot. At the next Step 314, similar to the above, the main control device 20 performs search alignment on the wafer W (in this case, the second wafer of the lot) loaded on the wafer holder 25.

In the wafer alignment of the next subroutine 316, as shown in FIG. 7, first, at Step 502, the main control device 20 performs EGA measurement, and determines at Step 504 whether the S-mode flag is set. In this case, since the S-mode flag is set to the first wafer W, the main control device 20 performs the subroutine 506.

In the subroutine 506, as shown in FIG. 8, at Step 602, the main control device 20 performs a cubic function approximation and at Step 604, calculates a random error. At Step 606, the main control device 20 determines whether the count value m of the counter is equal to or larger than a predetermined value g (=3) to determine whether the wafer W on the wafer holder 25 (wafer stage WST) is a g-th (third) wafer or a wafer subsequent to the g-th wafer in the lot. In this case, since the wafer W is the second wafer of the lot, the count value m of the counter is 2. Therefore, it is determined at Step 606 that the count value m of the counter is smaller than the predetermined value g. Thus, at Step 608, it is determined that there is no g-th wafer or a wafer subsequent to the g-th wafer. Then, the main control device 20 performs Step 610.

At Step 610, the main control device 20 determines whether a mathematical function mode is set. When it is determined that the mathematical function mode is set, the main control device 20 performs Step 614. On the other hand, when it is determined that the mathematical function mode is not set, the main control device 20 performs Step 616. When the mathematical function mode GCM measurement of the subroutine 614 is performed on the previous (first) wafer, the mathematical function mode is set. When the map mode GCM measurement of the subroutine 616 is performed on the previous (first) wafer, the mathematical function mode is reset. Here, the determination is made depends on the setting. In this way, when the mathematical function mode GCM measurement is performed on the first wafer W, it is also performed on the second wafer. On the other hand, when the map mode GCM measurement is performed on the first wafer W, it is also performed on the second wafer. Therefore, the GCM measurement is performed in the same mode on the wafers from the head wafer to a (g−1)th wafer. When the average mode is selected, it is possible to perform the average operation process of Steps 712 and 818 shown in FIGS. 9 and 10 without any difficulties.

The processes of the subroutines 614 and 616 are performed as described above, and thus a detailed description thereof will be omitted. When it is determined at Step 710 or 816 of the subroutine 614 or 616 that the average mode is set, the main control device 20 calculates the average value of the correction amount of the correction map or the coefficients of the mathematical function calculated for the first wafer and the correction amount of the correction map or the coefficients of the mathematical function calculated for the second wafer at Step 712 or 818, and stores the result of the calculation in the storage device as the correction map or the coefficients of the mathematical function for the second wafer.

The main control device 20 performs the subroutine 614 and Step 618 or the subroutine 616 and Step 620 to complete the subroutine 506, and then completes the subroutine 316 shown in FIG. 7. Then, exposure is performed at Step 318 shown in FIG. 5, similar to the first wafer. Then, it is determined at Step 320 that the count value m of the counter is smaller than 24, and the count value m of the counter is increased by 1 at Step 322. Steps 312 (wafer replacement) and 314 (search alignment) are performed on a third wafer W, and the subroutine 316 is performed again.

In the subroutine 316, Step 502 (EGA measurement), Step 504 (it is determined that the S-mode flag is set), and the subroutine 506 (single lot correction) are performed on the third wafer W.

In the subroutine 506, Step 602 (mathematical function fitting) and Step 604 (calculation of a random error) are performed, and the main control device 20 determines at Step 606 whether the count value m of the counter is equal to or greater than a predetermined value g (=3) in order to determine whether the wafer W loaded on the wafer holder 25 (wafer stage WST) is a g-th (third) wafer or a wafer subsequent to the g-th (third) wafer in the lot. In this case, since the wafer W is the third wafer of the lot, the count value m is 3. Therefore, it is determined at Step 606 that the count value m of the counter is equal to or larger than the predetermined value g, and the main control device 20 performs Step 622.

At Step 622, the main control device 20 determines whether a variation in the temperature of the third wafer W before and after the third wafer W is loaded onto the wafer stage WST, is larger than a predetermined threshold value, on the basis of the result detected by a temperature sensor TS, such as an infrared sensor. When it is determined that a variation in the temperature of the third wafer W is larger than a predetermined threshold value, the main control device 20 performs Step 624. If not, the main control device 20 performs Step 612. At Step 612, the mathematical function mode GCM measurement of the subroutine 614 or the map mode GCM measurement of the subroutine 616 is selected on the basis of the random error calculated at Step 604, and the selected subroutine is executed. The subsequent processes are the same as those performed on the first and second wafers.

Meanwhile, when it is determined at Step 622 that the variation in the temperature of the wafer W before and after loading is equal to or smaller than the predetermined threshold value, the main control device 20 performs Step 624 to determine whether a variation in random error between the previous wafer W and the current wafer is smaller than a predetermined threshold value. When it is determined that the variation in random error is equal to or larger than the predetermined threshold value, the main control device 20 performs Step 612. On the other hand, when it is determined that the variation in random error is smaller than the predetermined threshold value, the main control device 20 performs Step 626. The process after Step 612 is the same as described above. Meanwhile, at Step 626, the main control device 20 performs a general EGA operation to calculate coordinates of all shot areas on the wafer W. More specifically, similar to the above, the main control device 20 controls the alignment system AS to measure wafer marks provided in several shot areas (sample shot areas) on the wafer W that are previously selected, and calculates coordinates of the sample shot areas on the stage coordinate system. Then, the main control device 20 performs the EGA operation using Equation 1, on the basis of the calculated coordinates of the sample shot areas and coordinates thereof in the design, to calculate EGA parameters (coefficients $a_0$ to $a_2$ and $b_0$ to $b_2$).

At Step 628, the main control device 20 determines whether the mathematical function mode is set. When it is determined that the mathematical function mode is set, the main control device 20 performs Step 618. On the other hand, when it is determined that the mathematical function mode is not set, the main control device 20 performs Step 620. At Step 618, the main control device 20 corrects the coordinates (arrangement coordinates) of all the shot areas calculated at Step 626 on the basis of the latest correction-mathematical function, and stores the corrected coordinates (arrangement coordinates) in a predetermined area of the internal memory. In this case, double correction (excessive correction), that is, EGA correction and correction by a correction-mathematical function, is not performed on the coefficients $a_0$ to $a_2$ and $b_0$ to $b_2$ corresponding to linear components of the correction-mathematical function of Equation 2. Therefore, values subtracted by the coefficients $a_0$ to $a_2$ and $b_0$ to $b_2$ calculated by Equation 1 obtained by the EGA operation at Step 626 are used.

Meanwhile, at Step 620, the main control device 20 corrects the coordinates (arrangement coordinates) of all shot areas calculated at Step 626 on the basis of the latest correction map and stores the corrected coordinates (arrangement coordinates) of all the shot areas in a predetermined area of the internal memory.

After completing the subroutine 506 and the subroutine 316 shown in FIG. 7, the main control device 20 performs Step 318 in FIG. 5. At Step 318, similar to the above, an exposure process is performed on the third wafer W in the lot by a step-and-scan method. In this case, the stepping of the wafer W to an scanning start position (acceleration start position) where each shot area is exposed is performed on the basis of the arrangement coordinates of all shot areas stored in a predetermined area of the internal memory.

When the third wafer W of the lot is completely exposed in this way, the main control device 20 performs Step 320 to determine whether all wafers in the lot are completely exposed. However, in this case, it is determined that all wafers in the lot are not completely exposed, and thus Step 322 is performed. At Step 322, the main control device 20 increases the count value m, and returns to Step 312 to perform the same process as that performed on the third wafer W on the fourth wafer W (Step 312 (wafer replacement)→Step 314 (search alignment)→Subroutine 316 (wafer alignment)→Step 318 (exposure).

As described above, in the wafer alignment of the subroutine 316, when the third wafer W is processed and a variation in the temperature of the wafer W before and after loading is larger than a predetermined threshold value, the result of the determination at Step 622 is 'NO', and thus Step 612 is performed. At Step 612, the main control device 20 determines whether a random error is large. When it is determined that the random error is small, the mathematical function mode GCM measurement of the subroutine 614 is performed. On the other hand, when it is determined that the random error is large, the map mode GCM measurement of the subroutine 616 is performed. Therefore, non-linear components of the third wafer W are extracted by the GCM measurement. In addition, when a variation in random error in the second wafer is larger than a predetermined threshold value, it is determined at Step 624 that the variation in random error between the previous wafer W and the current wafer is larger than a predetermined threshold value, and Step 612 is performed. At the same time, the GCM measurement is performed on the third wafer W to extract non-linear components of an inter-shot error of the third wafer W. This process is similarly performed on the fourth wafer W. That is, it is determined whether the GCM measurement is performed on the fourth wafer W or only the general EGA measurement is performed on the fourth wafer W so that the correction-mathematical function and the correction map stored in the storage device are used as correction information of non-linear components at Step 626, on the basis of a variation in the temperature of the fourth wafer W before and after loading and a variation in random error between the third wafer W and the fourth wafer W.

When the fourth wafer W in the lot is completely exposed, Step 320 is performed to determine whether all wafers in the lot are completely exposed. In this case, it is determined that all wafers are not completely exposed, and thus Step 322 is performed. After the count value m increases at Step 322, the process returns to Step 312. Then, until all wafers are completely exposed, a loop process and determination of Steps 312 to 320 are repeatedly performed. Similarly, for fifth to twenty-fourth (the last) wafers, when the result of the determination at Steps 622 or 624 of the subroutine 506 is 'NO', the mathematical function mode GCM measurement or the map mode GCM measurement is performed on the corresponding wafer W. That is, this embodiment determines whether to perform GCM measurement on each wafer.

However, for the third and subsequent wafers, when the result of the determination at Steps 622 or 624 is 'NO' and non-linear components of an inter-shot error on the corresponding wafer W are newly extracted, correction information obtained from the extraction result of the wafer W becomes the latest correction information. Therefore, the latest correction information is used to correct the subsequent wafers W.

When all wafers in a lot are completely exposed and it is determined at Step 320 that the count value m of the counter is greater than 24, Step 324 is performed to notify the host 150 that exposure is completed through the LAN 160 and the terminal server 140. In this way, a series of processes are completed.

While the process of the lot is performed by the exposure apparatus $100_1$, the host 150 waits for the exposure process to be completed at Step 218 shown in FIG. 4, as described above.

When the host 150 receives a notice of completion of exposure from the main control device 20 of the exposure apparatus $100_1$ at Step 218, the waiting state of the host 150 at Step 218 is canceled, and the host 150 returns to Step 202. When conditions capable of starting lot processing on the wafers in this lot are satisfied, the host 150 repeatedly performs processes subsequent to Step 202.

<Multi-Lot Grid Correction>

Meanwhile, a case in which, when the first wafer W is processed, in the subroutine 308 shown in FIG. 6, the result of the determination at Step 402 is 'YES', or the results of the determination at Steps 406 and 410 are 'NO' and thus Step 412 is performed to reset the S-mode flag will be described below.

When the S-mode flag is reset, the result of the determination at Step 504 of the subroutine 316 shown in FIG. 7 is 'NO', and the subroutine 508 is performed.

Figure 11:
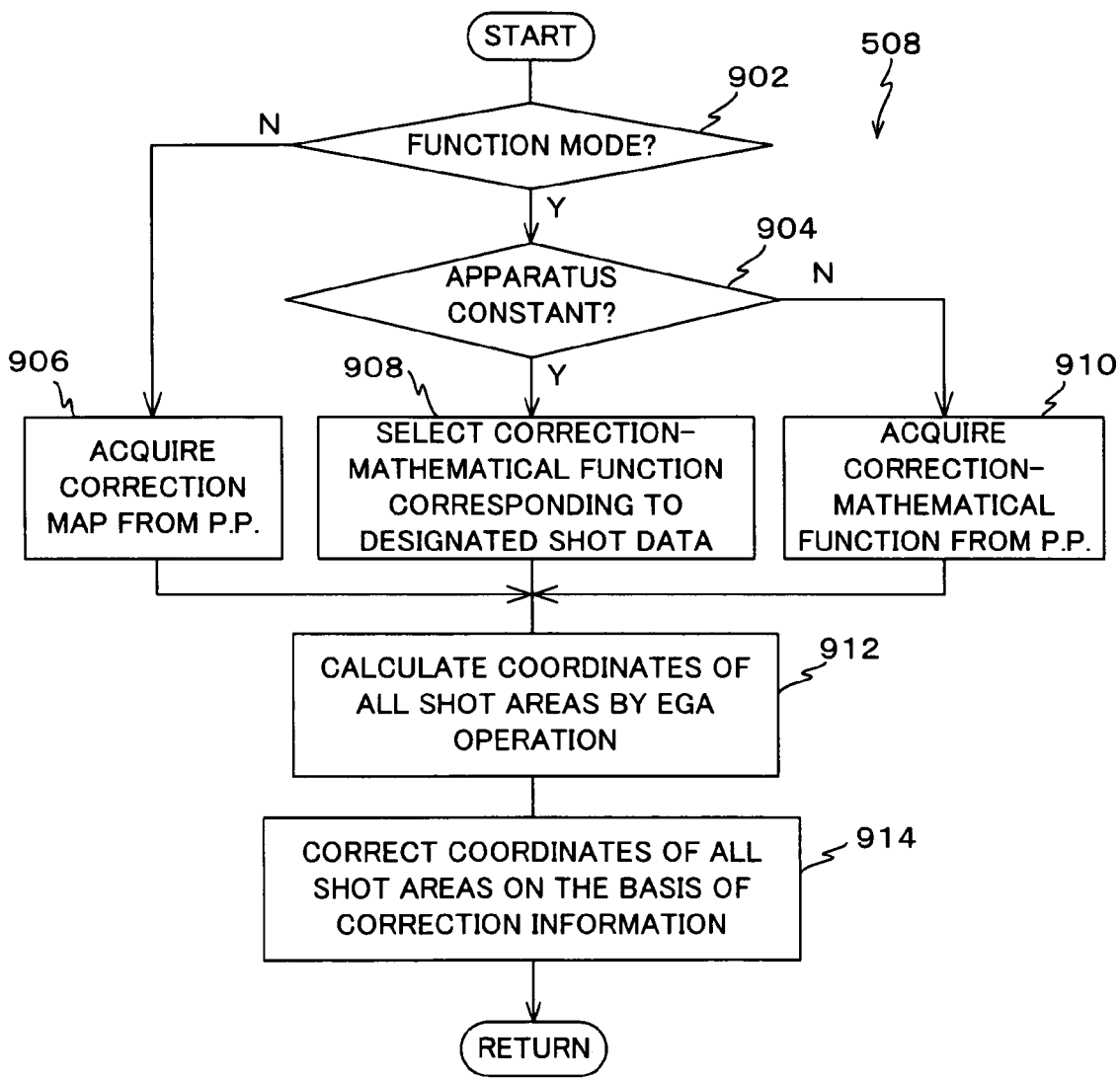
FIG. 11 is a flowchart illustrating a detailed process algorithm of a subroutine 508 of FIG. 7.

FIG. 11 is a flowchart illustrating the subroutine 508. As shown in FIG. 11, first, at Step 902, it is determined whether a mathematical function mode flag of a process program is set. When it is determined that the mathematical function mode flag is not set, Step 906 is performed. At Step 906, the main control device 20 acquires a correction information file name stored in the process program and reads a correction map file corresponding to the file name from the central information server 130.

When it is determined that the mathematical function mode flag is set, Step 904 is performed. At Step 904, the main control device 20 determines whether to use coefficients of a mathematical function set as apparatus constants as correction information with reference to the process program. When the result of the determination at Step 904 is 'YES', Step 908 is performed. At Step 908, coefficients of the correction-mathematical function corresponding to designated shot data are selected from the apparatus constants. When the result of the determination at Step 904 is 'NO', Step 910 is performed. At Step 910, a correction information file name is acquired from the process program, and a correction information file corresponding to the file name is read from the central information server 130, so that correction information is acquired.

In this case, the main control device 20 determines whether the correction information in the correction information file is a correction map or a mathematical correction function. When the correction information in the correction information file is the correction map, the main control device 20 performs mathematical function fitting on an inter-shot error included in the correction map to find coefficients of the mathematical function.

When Step 906, 908, or 910 is completed, Step 912 is performed. At Step 912, the main control device 20 performs EGA wafer alignment in the same manner as described above according to shot data included in the process program, such as information on the selection of a sample shot area and shot map data to calculate coordinates of all shot areas on the wafer W, and stores the coordinates in a predetermined area of the internal memory.

At the next Step 914, the main control device 20 calculates the overlay correction position of each shot area whose positional deviation (linear components and non-linear components) are corrected, on the basis of the arrangement coordinates of all shot areas stored in a predetermined area of the internal memory, and correction values (correction information) of the correction-mathematical function or the correction map temporarily stored in the internal memory for the non-linear component of the positional deviation of each shot area. When the correction-mathematical function used as correction information includes a linear component, similar to Step 618 (see FIG. 8), coefficients of the linear component of the correction-mathematical function is subtracted from EGA parameters, and the subtracted correction-mathematical function is used to correct coordinates of each shot area. After Step 914 is completed, the subroutine 508 and the subroutine 316 shown in FIG. 7 are sequentially completed, and Step 318 shown in FIG. 5 is performed.

Steps 318, 320, and 322 are performed in this order as described above. The same process as that performed on the first wafer W is executed on wafers from the second wafer to the last wafer. When exposure is completely performed on a predetermined number of wafers W, the result of the determination at Step 320 is "YES", and the next Step 324 is performed to notify the host 150 that exposure is completed through the LAN 160 and the terminal server 140. In this way, a series of processes are completed.

As can be seen from the above description, in the exposure apparatus 100₁, some components of the main control device 20, the illumination system 10, the projection optical system PL, the stages RST and WST, and a driving system therefor, form a transfer device. In addition, the temperature sensor TS, the alignment system AS, and some components of the main control device 20 form a measuring device.

Further, a selection device, a correction device, an extraction device, and an optimizing device are implemented by the main control device 20 (specifically, the CPU) and software programs. That is, the selection device is implemented by processes of the subroutine 308, Step 504 of the subroutine 316 shown in FIG. 7, and Steps 602 to 612, 622, and 624 of the subroutine 506 shown in FIG. 8 executed by the main control device 20. The function of the correction device is implemented by processes of Steps 618 and 620 of the subroutine 506 shown in FIG. 8, Step 814 of the subroutine 508 shown in FIG. 11, and Step 318 shown in FIG. 5. The functions of the extraction device and the optimizing device are implemented by the processes of subroutine 614 shown in FIG. 9 and the subroutine 616 shown in FIG. 10, respectively.

However, it goes without saying that the exposure device of this embodiment is not limited thereto. That is, this embodiment is just an illustrative example, and at least some of the components implemented by processes according to the software programs executed by the main control device 20 (exactly, the CPU) may be implemented by hardware.

More specifically, according to the correction method of this embodiment, when the exposure apparatus 100₁ has a plurality of correction functions (for example a mathematical function correcting function and a map correcting function) having non-linear components with different degree that can be considered for a two-dimensional grid, which is a reference for the position of each shot area to be formed on the wafer W, it is possible to select an optimum correction function on the basis of predetermined information (for example, the magnitude of a high-order component that is equal to or higher than the order of a non-linear component that can be considered) associated with at least one of the exposure apparatus 100₁ and the wafer W loaded into the exposure apparatus 100₁. In this way, when a plurality of shot areas are formed by pattern transfer on the wafer W, it is possible to correct the position of the wafer W, considering non-linear characteristics of the two-dimensional grid effectively in a short time, which is a reference for the position of each shot area to be formed on the wafer.

In this embodiment, the exposure apparatus 100₁ has the mathematical function correcting function (first and second mathematical function correcting functions) and the map correcting function (first and second correcting functions) as correction functions for correcting non-linear components having different degree that can be considered, among the non-linear components of the two-dimensional grid. The mathematical function correcting function approximately calculates non-linear components of the two-dimensional grid (wafer grid) that is defined by the arrangement of a plurality of shot areas formed on the wafer W by using a correction-mathematical function having a predetermined order and uses the correction-mathematical function as correction information for correcting the position of the wafer W when each shot area is formed by pattern transfer. In the mathematical function correcting function, the order of the non-linear component that can be considered is limited by the maximum order of the mathematical function, but it is possible to relatively reduce the number of times the shot areas are measured, that is, the number of sample shot areas. The map correcting function uses as correction information a correction map, which is a set of non-linear components of the positional deviation of each sample shot area whose actual position is measured. In the map correcting function, there is no restriction on the order of the non-linear components that can be considered. However, in map correcting function, in order to exactly grasp the maximum order of the non-linear components that can be considered in the mathematical function correction function, the number of sample shot areas needs to be larger than that in the mathematical function correcting function. Therefore, in this embodiment, for example, when the magnitude of a high-order component (a residual error and a random error) having a higher order than the non-linear component that can be considered in the mathematical function correcting function is equal to or larger than an allowable value, the map correcting function is used. On the other hand, when the magnitude of the high-order component is smaller than the allowable value, the mathematical function correcting function is selected. In this way, it is possible to decrease the magnitude of non-linear components that cannot be considered as much as possible and effectively correct the position of the wafer W in a short time without excessively increasing the number of shot areas.

In this embodiment, it is determined whether the magnitude of a high-order component (a residual error and a random error) having a higher order than non-linear components that can be considered by the mathematical function correcting function is equal to or larger than an allowable value. Therefore, positional information of a sufficient number of sample shot areas to appropriately calculate the magnitude of the random error is calculated (Step 502 of the subroutine 316 shown in FIG. 7), and a residual error (random error) between the actual position and the non-linear components that can be considered by the mathematical function correcting function in the sample shot areas is calculated as a high-order component having a higher order than non-linear components that can be considered by the mathematical function correcting function (Step 604 of the subroutine 506 shown in FIG. 8). When the magnitude of the random error is equal to or larger than an allowable value, the first map correcting function (subroutine 616: map mode GCM measurement) is selected. On the other hand, when the magnitude of the random error is within the allowable value, the first mathematical function correcting function (subroutine 614: mathematical function mode GCM measurement) is selected. In this way, it is possible to appropriately grasp the non-linear characteristics of the two-dimensional grid, which is a reference of the positions to be formed of the shot areas, and thus select the optimal correction function.

In this embodiment, the correction function having different degree of non-linear components that can be considered is classified into the mathematical function correcting function and the map correcting function. However, the correction function may be selected from at least two mathematical function correcting functions whose highest degree of correction-mathematical functions are different from each other. In this case, in a lower-order mathematical function correction function, when the residual error becomes excessively large, a higher-order mathematical function correcting function may be selected.

In this embodiment, the correction function is selected according to the non-linear characteristics of the two-dimensional grid, which is a reference for the positions where the shot areas are formed. In the selected correction function, the arrangement and the number of shot areas required to grasp the non-linear characteristics of the two-dimensional grid are optimized. For example, at Steps 702 to 708 of the subroutine 614 shown in FIG. 9 or Steps 802 to 810 of the subroutine 616 shown in FIG. 10, the arrangement and the number of shot areas are optimized until the residual error (random error) between positional information of each shot area based on correction information and the measured value thereof falls within an allowable range.

The order of the function may be optimized until the random error falls within the allowable range. The substantial equivalence of the optimization is achieved when the correction function is selected from at least two mathematical function correction functions for correcting functions whose highest degree of mathematical functions are different from each other. In addition, when the order of the mathematical function increases, the arrangement and the number of sample shot areas required for the fitting of the mathematical function are optimized.

Further, in this embodiment, the arrangement and the number of sample shot areas when a map is used as the correction information are optimized in accordance with the random error when the non-linear components of the grid are approximated by a mathematical function having a higher order than the mathematical function that is used as correction information in the correction function. However, when it is determined at Step 808 that the random error is sufficiently small, the high-order function used for the mathematical function fitting at Step 804 may be used as correction information. That is, switching from the map correcting function to the mathematical function correcting function may be performed for correction.

Furthermore, in this embodiment, the highest order of the correction mathematical function is 3, but the invention is not limited thereto. As the highest order of the correction-mathematical function increases, it is necessary to increase the number of sample shot areas to be measured required to calculate the random error. Therefore, it is desirable to determine the order of the correction-mathematical function so as to balance the number of sample shot areas and the order of the correction-mathematical function.

According to this embodiment, a plurality of grid correcting functions include: a first correction function of extracting correction information from each lot and of correcting the position of the wafer W on the basis of the extracted correction information; and a second correction function of correcting the position of the wafer W on the basis of the correction information measured beforehand. The first correction function extracts information on non-linear components (first non-linear components) of the two-dimensional grid (wafer grid) defined by the arrangement of a plurality of already-formed shot areas on the wafer W loaded into the exposure apparatus $100_1$ and uses the extracted result as correction information for correcting the position of the wafer W when each shot area is formed by pattern transfer on the wafer W. The first correction function needs to measure the positions of a plurality of shot areas in order to extract the non-linear components for the wafer W to be loaded into the exposure apparatus. In addition, the second correction function uses, as correction information, information on non-linear components (second non-linear components), which is extracted beforehand, of a two-dimensional grid with respect to a predetermined reference grid defined by the shot areas formed on, for example, a reference wafer. The second correction function does not need to measure the positions of a plurality of shot areas for extracting non-linear components for the wafer W to be loaded into the exposure apparatus. Therefore, for example, in the exposure apparatus, when characteristics of overlay errors among lots are different from each other and non-linear components need to be newly extracted from the wafer W to be loaded into the exposure apparatus, the first correction function is selected. If not, the second correction function is selected, which makes it possible to accurately correct the position of the wafer W in a short time.

Further, in this embodiment, when the first correction function is selected, for a predetermined number (g−1) of wafers W to be loaded into the exposure apparatus $100_1$ at the beginning, that is, the wafers W from the first wafer to a (g−1)th wafer, among the wafers W in a lot, the positions of shot areas formed on the wafers W are extracted, and information on non-linear components is extracted as correction information on the basis of the measured result. Then, for a g-th wafer W and wafers subsequent thereto, the positions of the shot areas formed on the wafers W are measured, and information on non-linear components is extracted as correction information on the basis of the measured result. However, whether to use, as correction information, the information of linear components extracted on the basis of the measured result or information on the non-linear components of the wafer W loaded into the exposure apparatus $100_1$ beforehand depends on a variation in the temperature of the wafer W before and after loading or a variation in random error between the wafers in the lot. That is, in this embodiment, it is determined whether to extract non-linear components of each wafer W, which makes it possible to take an appropriate measure against a variation of non-linear components in the lot.

Further, in this embodiment, when the result of the determination at Step 622 or 624 is 'NO' and thus it is necessary to extract non-linear components from the wafer W, Step 612 is performed to select the mathematical function mode GCM measurement or the map mode GCM measurement on the basis of the magnitude of the random error. However, the invention is not limited thereto. That is, when the mathematical function mode or the map mode is selected in the head of the lot, GCM measurement may be performed in the inside of the lot according to the mode selected in the head of the lot. When the result of the determination at Step 622 or 624 is 'NO' and thus it is necessary to extract non-linear components from the wafer W, the mathematical function mode GCM measurement may be performed, or the reverse may also be acceptable.

According to this embodiment, for the wafers W from the first wafer to a g-th wafer in the lots, when correction information is obtained on the basis of the measured result of the positional information of the already-formed shot areas on the wafer W loaded into the exposure apparatus $100_1$, it is determined whether to use the average value of information on the first non-linear components as the correction information or whether the correction information is based on only the measure result of the positional information of the shot areas formed on the wafer W loaded into the exposure apparatus at this time, on the basis of the average mode flag set as an apparatus constant. It may be determined whether to use the average value as the correction information on the basis of the same determination as that at Step 622 or 644 shown in FIG. 8. For example, when a variation in the temperature of the wafer W is within an allowable range or a variation in random error is small, the average value may be calculated at Step 712 of the subroutine 614 shown in FIG. 9 or Step 818 of the subroutine 616 shown in FIG. 10.

Further, in this embodiment, non-linear components of an inter-shot error are extracted from (g−1) wafers, counting from the first wafer in the head of the lot, but the invention is not limited thereto. The determination at Step 622 or 624 of FIG. 8 may be used as end conditions.

In this embodiment, predetermined information includes information indicating whether the wafer W loaded into the exposure apparatus $100_1$ is a bare wafer having no shot areas formed thereon. In the subroutine 308, when it is determined that the loaded wafer W is a bare wafer having no shot areas formed thereon, the S-mode flag is set (reset) to select the second correction function. It is possible to apply various information items as conditions to select the correction function. In this embodiment, as described above, for example, a variation in the temperature of the wafer W before and after the wafer W is loaded into the exposure apparatus $100_1$ (Step 622) or a variation in random error (that is, similarity: step 624) between the wafer W previously loaded into the exposure apparatus $100_1$ and the wafer W currently loaded into the exposure apparatus $100_1$ is used as a selection condition.

Information on the variation in the temperature of the wafer W before and after the wafer W is loaded into the exposure apparatus $100_1$ is used as the condition to determine whether to extract non-linear components from each wafer for the following reason. The temperature of the wafer W immediately after a coater applies a resist is high, but the temperature of the wafer W during the period from the loading of the wafer into the exposure apparatus $100_1$ to the actual exposure decrease, so that the wafer W is expanded and contracted due to the variation in the temperature, which causes a large variation in the non-linear components of each wafer W within the lot. For example, when the exposure apparatus $100_1$ processes wafers W in the lot, for several wafers W from the head, the time from loading to exposure is substantially constant, but while the wafer W after the several wafers is being processed, the next wafer W to be exposed waits for exposure on the loader (a robot arm for loading the wafer onto the wafer stage WST) until the current wafer W is completely exposed, which results in a long waiting time and a large variation in the temperature of the wafer W before and after the wafer W is loaded into the exposure apparatus. In addition, when the exposure apparatus $100_1$ stops processing the lot due to any reasons during lot processing and then restarts the lot processing, the next wafer W waits for exposure for a long time. In this case, it is not preferable to apply non-linear components of an inter-shot error extracted from the previous wafer W to the current wafer W.

The temperature variation depends on the length of the waiting time of the wafer W. Therefore, a timer provided in the exposure apparatus $100_1$ may measure the waiting time of the wafer W, without directly measuring the temperature variation as in this embodiment. When the waiting time is longer than a predetermined amount of time, non-linear components of the wafer W may be extracted.

Further, information having an effect on the non-linear components of the wafer W is not limited to the variation in the temperature of the wafer W described in this embodiment. For example, any information may be used as selection conditions of a plurality of correction functions as long as it is related to an environmental variation, such as a variation in the temperature or humidity of exposure atmosphere in the exposure apparatus, which has an effect on the non-linear components of an inter-shot error of the wafer W.

Information on the exposure apparatus used to form by pattern transfer the shot areas on the previous layer may also be used as the selection conditions. When the stage grids of the exposure apparatus $100_1$ and the exposure apparatus used for the previous layer are quite different from each other, or they are different from each other in an alignment method, it is expected that the non-linear components will be large. Therefore, in this case, it is necessary to select the second correction function.

Further, in this embodiment, the first correction function (which performs correction on each lot) or the second correction function (which performs correction between a plurality of lots) may be selected, or both the first correction function and the second correction function may be selected. For example, the position of the wafer W loaded into the exposure apparatus $100_1$ is corrected on the basis of a component having an order equal to or lower than a predetermined order that is included in information on the first non-linear component selected by the first correction function, and a component obtained by subtracting a component corresponding to the first non-linear component from a component having an order higher than a predetermined order that is included in information on the second non-linear component selected by the second correction function and a component having an order equal to or lower than the predetermined order that is included in the information on the second non-linear component. In this way, correction may be performed on non-linear components up to a third order by the first correction function, and correction may be performed on non-linear components having fourth or more degree by the second correction function capable of extracting non-linear components beforehand. As a result, it is possible to correct non-linear components considering the deformation of the wafer W due to the C/D by using the first correction function, while correcting high-order non-linear component of the stage grid of the exposure apparatus $100_1$, which makes it possible to accurately perform overlay exposure. In addition, it can reduce the number of sample shot areas during lot processing, compared to performing correction considering non-linear components having four or more degree of the stage grid by using only the first correction function, which is advantageous from the viewpoint of throughput.

Furthermore, in this embodiment, the exposure apparatuses $100_1$ to $100_N$ log EGA log data and send the EGA log data to the central information server 130 as exposure history data, but the invention is not limited thereto. For example, the exposure apparatuses $100_1$ to $100_N$ may log the result of the correction by the first correction function, that is, information on the calculated correction-mathematical function or correction map, information on the random error, and the detection signal detected by the alignment system AS, and may transmit these information items to the central information server 130 to be stored. In this way, the central information server 130 can evaluate the correction result of the position of the wafer W corrected by the first correction function. In addition, the central information server 130 may modify the correction-mathematical function or the correction map used for the second correction function on the basis of the evaluated result.

In the above embodiment, at Steps 622 and 624 of the subroutine 506 shown in FIG. 8, it is determined whether to extract non-linear components from each wafer in a lot. However, actually, GCM measurement may be performed on wafers at a predetermined interval in a lot from which non-linear components will be extracted. That is, similar to the above-described embodiment, a process of extracting non-linear components using the first correction function and a process of creating a correction-mathematical function or a correction map are performed on a predetermined number of wafers (for example, (g–1) wafers) from the head of the lot, but the invention is not limited thereto. For example, the process of extracting non-linear components and the process of creating the correction-mathematical function or the correction map may be performed on the wafers at an interval of K wafers (K is an integer equal to or greater than 2). In this way, it is also possible to cope with a variation in non-linear components in a lot. When the process of extracting non-linear components and the process of creating the correction-mathematical function or the correction map may be performed on the wafers at an interval of K wafers (when correction data is acquired by GCM measurement), correction is performed on the subsequent wafers on the basis of the acquired latest correction data.

Even when the interval K is defined, a large variation in the temperature of the wafer W or the random error may occur. In this case, the interval may be shortened to optimize the temperature or the random error.

When GCM measurement is performed in a lot at a predetermined interval, the interval may be increased or deceased to obtain the optimum alignment by logging the interval, sending the interval to the central information server 130, and evaluating the relationship between the alignment result and the interval.

In this embodiment, when EGA wafer alignment is performed, coordinates values of alignment marks of the sample shot areas (when all shot areas or in case that a plurality of specific shot areas are selected as sample shot areas, the selected specific shot areas) are used, but the invention is not limited thereto. For example, the wafer W may move according to coordinates of each sample shot area in the design to detect the positional deviation between the coordinates and a mark on the reticle R or an index mark of the alignment system AS and to calculate the positional deviation between the coordinates and the mark on the reticle R or the index mark of the alignment system AS or to calculate an amount of correction for a step pitch between shot areas on the basis of the detected result by using a statistical operation.

In addition, in the above-described embodiment, the EGA method is employed as wafer alignment, but the invention is not limited thereto. For example, a so-called weighted EGA method or a multipoint-in-shot EGA method may be used instead of the EGA method. A wafer alignment of the weighted EGA method is disclosed in detail in, for example, Japanese Unexamined Patent Application Publication No. 5-304077 (which corresponds to U.S. Pat. No. 5,525,808).

That is, in the weighted EGA method, coordinates of at least three sample shot areas in a stationary coordinate system that are selected beforehand from a plurality of shot areas (divided areas) on a wafer are measured. Then, each of coordinates of sample shot areas in a stationary coordinate system are weighted according to, for each of shot areas on a wafer, the distance between the shot area on the wafer (the center of the shot area) and the sample shot area (the center of the sample shot area), or according to the distance (first information) between the shot area and a predetermined point on the wafer and the distance (second information) between the predetermined point and each sample shot area. Then, by performing a statistical operation (a least square method or a simple averaging process) using a plurality of the weighted coordinates, coordinates of each of a plurality of the shot areas on the wafer in the stationary coordinate system are determined. On the basis of the determined coordinates of the plurality of shot areas, each of the plurality of shot areas arranged on the wafer is aligned with a predetermined reference position (for example, the transfer position of a reticle pattern) in the stationary coordinate system.

According to the weighted EGA method, even for a wafer having a local arrangement error (non-linear distortion), it is possible to accurately align each shot area with a predetermined reference position at high speed, while reducing the number of sample shot areas and the calculation amount. As long as the domestic statutes of designated states (or selected states) of this international application permit, the entire disclosure of Japanese Unexamined Patent Application Publication No. 5-304077 and U.S. Pat. No. 5,525,808 corresponding thereto is hereby incorporated by reference in its entirety.

The multipoint-in-shot EGA method is disclosed, for example, in Japanese Unexamined Patent Application Publication No. 6-349705 (which corresponds to U.S. Pat. No. 6,278,957). In this method, a plurality of alignment marks are detected in each sample shot area to obtain a plurality of (X, Y) coordinates, and a model function including as a parameter at least one of the shot parameters (chip parameters) corresponding to the rotation error, orthogonality, and scaling of shot areas as well as wafer parameters corresponding to the expansion and contraction, and rotation of wafers used in the EGA method is used to calculate positional information of each shot area, for example, coordinate values of each shot area.

The method will be described in more detail below. In the multipoint-in-shot EGA method, on each shot area arranged on a substrate, a plurality of alignment marks (either a one-dimensional mark or a two-dimensional mark) are formed at positions each having a predetermined positional relationship, in the design, with respect to a reference position in the shot area. Positional information of a predetermined number of alignment marks among the alignment marks existing on the substrate is measured. In the predetermined number of alignment marks, the sum of the number of X positional information items and the number of Y positional information items is larger than the total number of wafer parameters and shot parameters contained in the model-mathematical function, and a plurality of positional information items are obtained in the same direction in at least the same sample shot area. Then, these positional information items are substituted into the model-mathematical function and a statistical operation is performed on the positional information items by using, for example, the least square method, to calculate the parameters included in the model-mathematical function. Then, positional information of each shot area is calculated on the basis of the parameters, and positional information of the reference position in each shot area in the design and relative positional information of alignment marks with respect to the reference position in the design. As long as the domestic statutes of designated states (or selected states) of this international application permit, the entire disclosure of Japanese Unexamined Patent Application Publication No. 6-349705 (which corresponds to U.S. Pat. No. 6,278,957) is hereby incorporated by reference in its entirety.

In this case, coordinate values of the alignment marks may also be used as positional information. However, any information may be used as the positional information as long as it is related to alignment marks and is suitable for a statistical process.

In the above-described embodiment, an FIA system (field image alignment sensor) of an off-axis system is used as a mark detection system, but the invention is not limited thereto. For example, any one of a TTR (through the reticle) system, a TTL (through the lens) system, the off-axis system may be used, and systems for detecting diffraction light or scattered light other than an image formation system (an image processing method) used for the FIA system may be used. Furthermore, for example, an alignment system may be used in which coherent beams are incident on an alignment mark on a wafer substantially in the vertical direction, and diffraction light beams (±first diffraction light, ±second diffraction light, . . . , ±n-th diffraction light) having the same order that are generated from the mark interfere with each other, which causes the alignment marks to be detected. In this case, the diffraction light beams may be independently detected in every order, and the detection result of at least one of the orders may be used. Alternatively, coherent light beams having different wavelengths may be incident on the alignment mark, and diffraction light beams having the same order may interfere with each other in each wavelength range, which causes the alignment marks to be detected.

Furthermore, this embodiment is not limited to a step-and-scan exposure apparatus, but the invention can be applied to various types of exposure apparatuses, such as a step-and-repeat exposure apparatus and a proximity-type exposure apparatus (an X-ray exposure apparatus).

In the above-described embodiment, for example, any of the following light sources may be used as the light source: a distant ultraviolet light source, such as an ArF excimer laser or a KrF excimer laser; a vacuum ultraviolet light source, such as an $F_2$ laser; and an ultra high-pressure mercury lamp emitting lines within an ultraviolet region (such as the g-line or the i-line). When light in the vacuum ultraviolet region is used as illumination light for exposure, the invention is not limited to the laser beams emitted from the above-mentioned light sources, but a harmonic wave may also be used which is obtained by amplifying a single-wavelength laser beam in the infrared or visible region emitted by a DFB semiconductor laser or a fiber laser with a fiber amplifier doped with, for example, erbium (Er) (or both erbium and ytterbium (Yb)), and by converting the wavelength into ultraviolet light using a nonlinear optical crystal.

The invention may be applied to an exposure apparatus using EUV light, X-rays, or charged particle beams, such as electron beams or ion beams, as illumination light for exposure. In addition, the invention is applicable, for example, to a liquid immersion type exposure apparatus having a liquid filled between a projection optical system PL and a wafer W, which is disclosed in the pamphlet of International Publication No. WO99/49504. The invention is also applicable, for example, to an exposure apparatus of a twin wafer stage type in which wafer stages are provided at an exposure position where transfer of a reticle pattern is performed through a projection optical system and a measurement position (alignment position) where a mark is detected by a wafer alignment system, so that an exposure operation and an alignment operation can be performed substantially simultaneously, which is disclosed in the pamphlet of International Publication No. WO98/40791 and Japanese Unexamined Patent Application Publication No. 10-214783. In addition, the projection optical system PL may be any one of a dioptric system, a catadioptric system and a reflective system, or it may be any one of a reduction system, a 1× magnification system, and an enlargement system.

In the above-described embodiment, a transmissive mask having a light-shielding pattern (or a phase pattern or a light-reducing pattern) formed on a transmissive substrate, or a reflective mask having a predetermined reflection pattern on a reflective substrate is used, but the invention is not limited thereto. Instead of these masks, an electronic mask forming a transmission pattern, a reflection pattern, or a light-emitting pattern on the basis of electronic data of a pattern to be exposed may be used. The electronic mask is disclosed in, for example, U.S. Pat. No. 6,778,257. As long as the domestic statutes of designated states (or selected states) of this international application permit, the entire disclosure of U.S. Pat. No. 6,778,257 is hereby incorporated by reference in its entirety.

The electronic mask includes both a non-emitting image display device and a self-emitting image display device. The non-emitting image display device is called a spatial light modulator which is a device that spatially modulates the amplitude of light, the state of a phase, or the state of polarized light, and is classified into a transmissive spatial light modulator and a reflective spatial light modulator. The transmissive spatial light modulator includes, for example, a transmissive liquid crystal display (LCD) and an electrochromic display (ECD). The reflective spatial light modulator includes, for example, a DMD (digital mirror device, or digital micro-mirror device), a reflection mirror array, a reflective liquid crystal display device, an electrophoretic display (EPD), an electronic paper (or an electronic ink), and a grating light valve.

In addition, the self-emitting image display device includes, for example, a CRT (cathode ray tube), an inorganic EL (electro-luminescence) display, a field emission display (FED), a plasma display panel (PDP), and a solid-state light source chip having a plurality of luminous points, a solid-state light source chip array having chips arranged in a plurality of arrays, or a solid-state light source array having a plurality of luminous points on one substrate (for example, an LED (light emitting diode) display, an OLED (organic light emitting diode) display, and an LD (laser diode) display). Further, when fluorescent materials provided in each pixel of the plasma display (PDP) are removed, the PDP serves as a self-emitting image display device that emits light in the ultraviolet region.

Further, the invention is not limited to an exposure apparatus for manufacturing semiconductors, but the invention can also be applied to various exposure apparatuses, such as an exposure apparatus that is used for manufacturing displays including liquid crystal display devices and transfers a device pattern onto a glass plate, an exposure apparatus that is used for manufacturing thin-film magnetic heads and transfers a device pattern onto a ceramic wafer, and an exposure apparatus that is used for manufacturing imaging devices (for example, a CCD), micromachines, an organic EL device, and a DNA chips. In addition, the invention can be applied to an exposure apparatus that transfers a circuit pattern onto a glass substrate, a silicon wafer or the like to manufacture a reticle or a mask used for exposure apparatuses, such as an optical exposure apparatus, an EUV exposure apparatus, an X-ray exposure apparatus, and an electron beam exposure apparatus, in addition to manufacturing microdevices, such as semiconductor devices. In this case, in general, a transmissive reticle is used for the exposure apparatus that uses, for example, DUV (distant ultraviolet) light or VUV (vacuum ultraviolet) light, and the reticle substrate is formed of a material, such as silica glass, fluorine-doped silica glass, fluorite, magnesium fluoride, crystal or the like. Further, a transmissive mask (a stencil mask or a membrane mask) is used in a proximity-type X-ray exposure apparatus or an electron beam exposure apparatus, and, for example, a silicon wafer or the like is used as the mask substrate.

The semiconductor device is manufactured through the following steps: a step of designing the function and performance of a device; a step of manufacturing a reticle on the basis of the design step; a step of manufacturing a wafer with a silicon material; a step of transferring a reticle pattern onto the wafer by using the lithography system 110 and the exposure apparatus 100$_i$ according to this embodiment; a step of assembling a device (including a dicing process, a bonding process, and a package process), a test step and the like.

INDUSTRIAL APPLICABILITY

The correction method and the exposure apparatus according to the invention are suitable to continuously or intermittently perform exposure on a plurality of photosensitive objects.

The invention claimed is:

1. A correction method used when a plurality of divided areas are formed by pattern transfer onto each of a plurality of photosensitive objects that are sequentially loaded into an exposure apparatus, the method correcting a position of each of the photosensitive objects, the method comprising:
    selecting at least one of a plurality of correction functions that have different degrees of non-linear components that can be considered by considering the non-linear components of a positional error of a two-dimensional grid with respect to an ideal grid or a predetermined reference grid, on the basis of predetermined information associated with at least one of the exposure apparatus and the photosensitive object loaded into the exposure apparatus,
    wherein:
        the plurality of correction functions are provided in the exposure apparatus in order to correct the position of the photosensitive object,
        the two-dimensional grid is a reference for the position where each of the divided areas is formed,
        the predetermined information is information having an effect to the non-linear components of a positional error among the plurality of divided areas formed on the loaded photosensitive object with respect to positions in a design, the positional error being represented by the two-dimensional grid, and
        the plurality of correction functions include:
        at least one first correction function that extracts information on a first non-linear component of the positional error of the two-dimensional grid with respect to the ideal grid, which is defined by a detection result of an arrangement of a plurality of already-formed divided areas on the photosensitive object loaded into the exposure apparatus, and uses the information extracted as correction information for correcting the position of the photosensitive object when each of the divided areas is formed by pattern transfer; and
        at least one second correction function that uses, as the correction information, information on a second non-linear component extracted beforehand, which is a non-linear component of the positional error of the two-dimensional grid with respect to the reference grid.

2. The correction method according to claim 1, wherein
    in the selecting of the correction function, when the first correction function is selected:
    positional information of each of the already-formed divided areas on a predetermined number of photosensitive objects that are loaded in the exposure apparatus at the beginning, among the plurality of photosensitive objects, is measured, and information on the first non-linear component is extracted as the correction information on the basis of the measured result, and
    positional information of the already-formed divided areas on the other photosensitive objects is measured, and it is determined whether to extract the information on the first non-linear component as the correction information, on the basis of the measured result or to use information on the first non-linear component of the photosensitive object loaded in the exposure apparatus beforehand as the correction information, on the basis of the predetermined information.

3. The correction method according to claim 2,
    wherein, when the correction information is obtained on the basis of the measured result of the positional information of the already-formed divided areas on the predetermined number of photosensitive objects loaded into the exposure apparatus, it is determined on the basis of the predetermined information whether to use as the correction information the average value of information on the first non-linear component or to use as the correction information on the first non-linear component based on only the measured result of the positional information of the already-formed divided areas of a photosensitive object loaded at this time.

4. The correction method according to claim 1, wherein:
the predetermined information includes information indicating whether the already-formed divided areas are formed on the photosensitive object loaded into the exposure apparatus, and
in the selecting of the correction function, when the already-formed divided areas are not formed on the loaded photosensitive object, the second correction function is selected.

5. The correction method according to claim 1, further comprising:
correcting, when the first correction function and the second correction function are selected in the selecting of the correction function, the position of each of the photosensitive objects loaded into the exposure apparatus, using as the correction information a first component having an order equal to or lower order than a predetermined order that is included in information on the first non-linear component and a second component obtained by subtracting a component corresponding to the first component from components included in information on the second non-linear component.

6. The correction method according to claim 1,
wherein the correction functions having different degrees of non-linear components that can be considered include:
at least one mathematical function correcting function that uses a mathematical function including a term of a predetermined order which is obtained by approximating non-linear components of the two-dimensional grid as correction information for correcting the position of the photosensitive object when each of the divided areas is formed by pattern transfer; and
at least one map correcting function that uses as the correction information a correction map, which is a set of non-linear components of each of the divided areas corresponding to the non-linear components of the two-dimensional grid.

7. The correction method according to claim 6,
wherein the predetermined information includes a residual error between actually measured positional information of a plurality of already-formed divided areas on the photosensitive object loaded into the exposure apparatus and positional information of the already-formed divided areas based on the correction information obtained when the mathematical function correcting function is selected, and
in the selecting of the correction function, when the residual error is equal to or larger than an allowable value, the map correcting function is selected.

8. The correction method according to claim 6, further comprising:
optimizing at least one of the order of the mathematical function and the arrangement and number of already-formed divided areas whose positional information should be measured until the residual error between the positional information of each of the already-formed divided areas based on the correction information and the actually measured positional information thereof falls within an allowable range, after the selecting of the correction function is performed.

9. The correction method according to claim 1,
wherein the predetermined information includes at least one of information on an environmental variation before and after the photosensitive object is loaded into the exposure apparatus, information on waiting time of the photosensitive object from loading of the photosensitive object into the exposure apparatus to exposure, information on an exposure apparatus used to transfer a plurality of already-formed divided areas onto the photosensitive object, and information on difference between the non-linear component of the photosensitive object previously loaded into the exposure apparatus and the non-linear component of the photosensitive object currently loaded into the exposure apparatus.

10. The correction method according to claim 9,
wherein the information on the environmental variation comprises a variation in the temperature of the photosensitive object.

11. A correction method of, when a plurality of divided areas are formed by pattern transfer onto each of a plurality of photosensitive objects that are sequentially loaded into an exposure apparatus, correcting a position of each of the photosensitive objects, the method comprising:
the correction method according to claim 1, wherein:
the predetermined information includes at least one of information on an environmental variation before and after the photosensitive object is loaded into the exposure apparatus, information on waiting time of the photosensitive object from loading of the photosensitive object into the exposure apparatus to exposure, information on an exposure apparatus used to transfer a plurality of already-formed divided areas onto the photosensitive object, and information on difference between the non-linear component of the photosensitive object previously loaded into the exposure apparatus and the non-linear component of the photosensitive object currently loaded into the exposure apparatus, and
the information on the environmental variation comprises information on a variation in humidity of an exposure atmosphere in the exposure apparatus.

12. An exposure apparatus for forming by pattern transfer a plurality of divided areas onto each of a plurality of photosensitive objects, the apparatus comprising:
a transfer device that includes a movable body for holding a loaded photosensitive object and forms by pattern transfer the plurality of divided areas onto the photosensitive object held by the movable body;
a selection device that selects at least one of a plurality of correction functions having different degrees of non-linear components that can be considered by considering non-linear components of a positional error of a two-dimensional grid with respect to an ideal grid or a predetermined reference grid, on the basis of predetermined information associated with at least one of the transfer device and the photosensitive object held by the movable body;
a correction device that has the plurality of correction functions and uses the at least one correction function selected by the selection device to correct a position of the photosensitive object held by the movable body when the photosensitive object held by the movable body is aligned at a predetermined position;
a measuring device that measures an actually measured value of positional information of an arbitrary one of the plurality of divided areas on the photosensitive object held by the movable body; and an extraction device that extracts information on the non-linear components of the two-dimensional grid that is defined by an arrangement of the plurality of divided areas on the photosensitive object held by the movable body from the result measured by the measuring device, wherein:
the correction functions are provided in the exposure apparatus to correct the position of the photosensitive object, the two-dimensional grid is a reference for the position where each of the divided areas is formed, the predetermined information is information having an effect to the non-linear components of a positional error among the plurality of divided areas formed on the loaded photosensitive object with respect to positions in a design, the positional error being represented by the two-dimensional grid, and the correction device has as the plurality of correction functions:

at least one first correction function that, when the extraction device extracts information on a first non-linear component of the positional error of the two-dimensional grid with respect to the ideal grid, which is defined by a detection result of the arrangement of a plurality of already-formed divided areas on the photosensitive object held by the movable body, uses the information extracted by the extraction device as correction information for correcting the position of the photosensitive object when each of the divided areas is formed by pattern transfer; and at least one second correction function that uses, as the correction information, information on a second non-linear component extracted beforehand, which is a non-linear component of the positional error of the two-dimensional grid with respect to the reference grid.

13. The exposure apparatus according to claim 12, wherein the correction device has as a plurality of correction functions having different degrees of non-linear components that can be considered:

at least one mathematical function correcting function that uses a mathematical function including a term of a predetermined order which is obtained by approximating non-linear components of the two-dimensional grid as correction information for correcting the position of the photosensitive object when the transfer device forms by pattern transfer each of the divided areas on the photosensitive object held by the movable body; and at least one map correcting function that uses as the correction information a correction map, which is a set of non-linear components of each of the divided areas corresponding to the non-linear components of the two-dimensional grid.

14. The exposure apparatus according to claim 13, further comprising:

an optimizing device that optimizes at least one of the order of the mathematical function and the arrangement and number of divided areas whose positional information should be measured until a residual error between the positional information of each of the divided areas based on the correction information that is used by the correction function selected by the selection device and the actually measured value of the positional information of each of the divided areas measured by the measuring device falls within an allowable range.

15. The exposure apparatus according to claim 13, wherein the predetermined information includes information on the difference between the non-linear component of the photosensitive object previously loaded into the transfer device and the non-linear component of the photosensitive object currently loaded into the transfer device, which is extracted on the basis of the result measured by the measuring device.

16. The exposure apparatus according to claim 12, further comprising:

a detection device,
wherein:
the predetermined information includes at least one of information on an environmental variation before and after the photosensitive object is loaded into the transfer device and information on waiting time of the photosensitive object from loading of the photosensitive object into the transfer device to exposure, and the detection device detects at least one information item included in the predetermined information.

17. The exposure apparatus according to claim 16, wherein the information on the environmental variation comprises a variation in the temperature of the photosensitive object.

18. The exposure apparatus according to claim 12, wherein the predetermined information includes at least one of information indicating whether the divided areas are formed on the photosensitive object loaded into the transfer device and information on the exposure apparatus used to form by pattern transfer each of the divided areas.

19. The exposure apparatus according to claim 12, further comprising:

a detection device,
wherein the predetermined information includes at least one of information on an environmental variation before and after the photosensitive object is loaded into the transfer device and information on waiting time of the photosensitive object from the loading of the photosensitive object into the transfer device to exposure, the detection device detects at least one information item included in the predetermined information, and the information on the environmental variation comprises information on a variation in humidity of an exposure atmosphere in the exposure apparatus.

20. A measuring device used when a plurality of divided areas are formed by pattern transfer onto each of a plurality of photosensitive objects sequentially loaded into an exposure apparatus, the measuring device measuring predetermined information used to correct a position of each of the photosensitive objects, wherein:
the predetermined information is used to select at least one of a plurality of correction functions having different degrees of non-linear components that can be considered by considering non-linear components of a positional error of a two-dimensional grid with respect to an ideal grid or a predetermined reference grid, and is information having an effect to the non-linear components of a positional error among the plurality of divided areas formed on the loaded photosensitive object with respect to positions in a design, the positional error being represented by the two-dimensional grid, the correction functions are provided in the exposure apparatus to correct the position of the photosensitive object, the two-dimensional grid is a reference for the position where each of the divided areas is formed, and the exposure apparatus has as the plurality of correction functions:

at least one first correction function that, when an extraction device extracts information on a first non-linear component of the positional error of the two-dimensional grid with respect to the ideal grid, which is defined by a detection result of the arrangement of a plurality of already-formed divided areas on the photosensitive object held by the movable body, uses the information extracted by the extraction device as correction information for correcting the position of the photosensitive object when each of the divided areas is formed by pattern transfer; and at least one second correction function that uses, as the correction information, information on a second non-linear component extracted beforehand, which is a non-linear component of the positional error of the two-dimensional grid with respect to the reference grid.

21. The measuring device according to claim 20, wherein:
the measuring device is an overlay measuring device that measures an overlay error of patterns formed between different layers on the photosensitive object, and
the predetermined information includes overlay error information between a continuous series of lots.

22. The measuring device according to claim 20, wherein
the predetermined information includes at least one of information on an environmental variation before and after the photosensitive object is loaded into the exposure apparatus, information on waiting time of the photosensitive object from loading of the photosensitive object into the exposure apparatus to exposure, information on an exposure apparatus used to transfer a plurality of already-formed divided areas onto the photosensitive object, and information on difference between the non-linear component of the photosensitive object previously loaded into the exposure apparatus and the non-linear component of the photosensitive object currently loaded into the exposure apparatus, and
the information on the environmental variation comprises information on a variation in humidity of an exposure atmosphere in the exposure apparatus.

23. A measuring device comprising:
a measuring unit that measures predetermined information used to: (1) correct a position of each of a plurality of photosensitive objects, and (2) select at least one of a plurality of correction functions having different degrees of non-linear components that can be considered by considering non-linear components of a positional error of a two-dimensional grid with respect to an ideal grid or a predetermined reference grid; and
a transmission unit that sends the predetermined information measured by the measuring unit to a server that is separately provided from the measuring unit and stores various types of information, wherein:
the predetermine information is measured when a plurality of divided areas are formed by pattern transfer on each of the plurality of photosensitive objects that are sequentially loaded into an exposure apparatus, the correction functions are provided in the exposure apparatus to correct the position of the photosensitive object, the two-dimensional grid is a reference for the position where each of the divided areas is formed, the predetermined information is information having an effect to the non-linear component of a positional error among the plurality of divided areas formed on the loaded photosensitive object with respect to positions in a design, the positional error being represented by the two-dimensional grid, and the exposure apparatus has as the plurality of correction functions:

at least one first correction function that, when an extraction device extracts information on a first non-linear component of the positional error of the two-dimensional grid with respect to the ideal grid, which is defined by a detection result of the arrangement of a plurality of already-formed divided areas on the photosensitive object held by the movable body, uses the information extracted by the extraction device as correction information for correcting the position of the photosensitive object when each of the divided areas is formed by pattern transfer; and at least one second correction function that uses, as the correction information, information on a second non-linear component extracted beforehand, which is a non-linear component of the positional error of the two-dimensional grid with respect to the reference grid.

24. The measuring device according to claim 23, wherein:
the measuring device is an overlay measuring device that measures an overlay error of patterns formed between different layers on the photosensitive object, and
the predetermined information includes overlay error information between a continuous series of lots.

25. The measuring device according to claim 23, wherein
the predetermined information includes at least one of information on an environmental variation before and after the photosensitive object is loaded into the exposure apparatus, information on waiting time of the photosensitive object from loading of the photosensitive object into the exposure apparatus to exposure, information on an exposure apparatus used to transfer a plurality of already-formed divided areas onto the photosensitive object, and information on difference between the non-linear component of the photosensitive object previously loaded into the exposure apparatus and the non-linear component of the photosensitive object currently loaded into the exposure apparatus, and
the information on the environmental variation comprises information on a variation in humidity of an exposure atmosphere in the exposure apparatus.

* * * * *

UNITED STATES PATENT AND TRADEMARK OFFICE
CERTIFICATE OF CORRECTION

| | | |
|---|---|---|
| PATENT NO. | : 8,130,362 B2 | Page 1 of 1 |
| APPLICATION NO. | : 11/662725 | |
| DATED | : March 6, 2012 | |
| INVENTOR(S) | : Kawakubo | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 763 days.

Signed and Sealed this
Eleventh Day of September, 2012

David J. Kappos
*Director of the United States Patent and Trademark Office*